United States Patent [19]
Park et al.

[11] Patent Number: 5,367,489
[45] Date of Patent: Nov. 22, 1994

[54] VOLTAGE PUMPING CIRCUIT FOR SEMICONDUCTOR MEMORY DEVICES

[75] Inventors: Chan-Sok Park, Kyungki; Young-Gwon Choi; Dong-Jae Lee, both of Seoul; Do-Chan Choi; Dong-Soo Jun, both of Seoul; Yong-Sik Seok, Kyungki, all of Rep. of Korea

[73] Assignee: Samsung Electronics Co., Ltd., Suwon, Rep. of Korea

[21] Appl. No.: 972,780

[22] Filed: Nov. 9, 1992

[30] Foreign Application Priority Data

Nov. 7, 1991 [KR] Rep. of Korea .......................... 19740
Nov. 13, 1991 [KR] Rep. of Korea .......................... 20137
Dec. 4, 1991 [KR] Rep. of Korea .......................... 22108
Jun. 26, 1992 [KR] Rep. of Korea .......................... 11242

[51] Int. Cl.⁵ .............................................. G11C 7/00
[52] U.S. Cl. ...................... 365/189.11; 365/189.09; 365/226; 327/534; 327/536

[58] Field of Search ................... 365/189.06, 189.07, 365/189.09, 189.11, 226; 307/296.2, 296.6; 363/60, 61

[56] References Cited

U.S. PATENT DOCUMENTS 4,403,158  9/1983  Slemmer ..................... 307/296.2
5,038,325  8/1991  Douglas et al. ............. 365/189.09 X Primary Examiner—Joseph A. Popek
Attorney, Agent, or Firm—Cushman, Darby & Cushman

[57] ABSTRACT

A high density semiconductor device is provided with an improved voltage pumping (bootstrapping) circuit. The voltage pumping circuit generates at an initial power-up state a first output voltage which is substantially identical to the memory device source supply voltage. The pumping circuit then pumps the first output voltage up to a second output voltage which is higher than the first output voltage. The pumping operation is achieved prior to or upon the semiconductor memory device being enabled in response to a series of pulses output from an oscillator.

43 Claims, 15 Drawing Sheets

VOLTAGE PUMPING CIRCUIT FOR SEMICONDUCTOR MEMORY DEVICES

BACKGROUND OF THE INVENTION

1. Field of the Invention

The present invention relates to high density semiconductor memory devices and more particularly, to a circuit for applying a pumped voltage which is greater than the source supply voltage, to components within the high density semiconductor memory devices.

2. Description of the Related Art

The complexity of semiconductor memory devices has rapidly increased so that memory devices having a capacity of several tens of mega bits (Mbit) are fabricated under design tolerances of 1-micron (micrometer) or less.

Such semiconductor memory devices comprise mostly a plurality of CMOS elements having operating voltages applied across thin dielectric films.

As the complexity increases, the space between CMOS elements or signal lines is reduced along with the thickness of the dielectric films. Thus, it becomes necessary to lower chip operating voltage.

For example, 64 Mbit memory devices usually have an operating voltage of 1.5V. However, if the operating voltage of the memory device is improvidently lowered, the voltage drop caused by the threshold voltage of the respective MOS transistors and the resistances of signal lines during the transmission of data signals will often make it impossible to read and write the data.

In order to solve this problem, the externally applied source voltage is amplified within the chip of the memory device. Such amplifying means are better known as pumping circuits, bootstrapping circuits or voltage-raising circuits. For consistency, in the present application, such a circuit will be referred to as a pumping circuit.

As shown in FIG. 1A which illustrates a conventional pumping circuit, enable clock pulses are applied to drive circuit 1, 2 and to a first electrode of a pumping capacitor 3, providing at the other electrode a pumped voltage Vpp which is increased by coupling to a voltage level greater than that of the voltage applied to the first electrode.

Although this pumping circuit has a simple structure, there is not provided a way for stabilizing the output of pumping capacitor 3. Therefore, its operational reliability decreases when used in high density memory devices which demand a much lower operating voltage. Moreover, it is also difficult to adjust the timing of the enable clock pulses.

In order to improve the pumping circuit of FIG. 1A, a voltage pumping circuit as shown in FIG. 1A, originally disclosed in the IEEE JOURNAL OF SOLID-STATE CIRCUIT, VOL.24, NO.3, JUNE 1989, has been proposed.

In FIG. 1B, ΦPHB represents a word line precharge signal, Φ1 and Φ2 represent clock signals to enable row address signals, and OSC represents an oscillator output. When the chip is enabled from standby, i.e., precharging is performed before and after a read/write operation, the word line precharge signal ΦPHB is set to level Vpp. In the operational mode of the chip, the signal ΦPHB is supplied with ground voltage level (0V).

As shown in FIG. 1B, if the voltage level of word line precharge signal ΦPHB drops from Vpp level to 0V, clock signals Φ1 and Φ2 are raised to Vcc level. Subsequently, clock signal Φ1 initiates a coupling effect on capacitors C1 and C2 to pump the voltages of signal lines G1 and G2 to level Vcc level or even greater. Similarly, clock signal Φ2 initiates a coupling effect on capacitors C3 and C4 to pump the voltages of signal lines G3 and G4 to a level Vpp which is greater than level Vcc.

Thereafter, the pumped voltages of signal lines G1 and G2 are dropped to 0V by clock signal Φ2. The voltages of signal lines G3 and G4 represent the output Vpp. As the chip changes its state from operational mode to standby mode, word line precharge signal ΦPHB is applied with voltage Vpp level. As a result, the output of prior art FIG. 1B results in voltage level Vcc, the voltage Vpp level being produced only when a given row address signal is applied active (operational mode).

Although the circuit of FIG. 1B overcomes tile problems associated with unstable Vpp voltages and the imprecise timing of input signal response, other problems originate. Namely, additional circuits necessary for generating the word line precharge signal ΦPHB and clock signals Φ1 and Φ2 are required. The addition of further non-memory circuitry reduces memory capacity and degrades chip density.

Moreover, voltage Vpp is output when a row address signal is applied active, enabling clock signals Φ1 and Φ2 and thereby degrading the operational speed of the chip.

Additionally, the circuit of FIG. 1B provides poor voltage pumping efficiency when used with semiconductor memory devices of densities in the order of 16 Mbits or 64 Mbits.

FIG. 1C shows another conventional voltage pumping circuit proposed by Yoshinobu Nakakome, et al in an article entitled "An Experimental 1.5-V 64 Mbit DRAM", IEEE Journal of Solid State Circuits, Vol.26, No.4, April 1991, pp.465–472. This article discloses a word line driver circuit for preventing the word line voltage from being dropped by a threshold voltage of an access transistor.

As shown in FIG. 1C, the word line driver produces a pumped voltage $V_{CH}$ of voltage level 2Vcc by a feedback operation of charge pump circuits CP1 and CP2 even under low operating voltage conditions. This circuit, however, exhibits the following problems:

First, the capacitance of capacitor CcH connected to node VcH becomes so great that the area of the chip is increased. When a voltage "high" level is transferred to a selected word line, charge sharing occurs between capacitor $C_{CH}$ and the capacitance component $C_{WL}$ of the word line. This relationship may be expressed by the following equation (1):

$$C_{CH} \times V_{CH} = (C_{WL} + C_{CH}) \times V_{WL}$$

$$V_{WL} = [C_{CH}/(C_{WL} + C_{CH})] \times V_{CH} \qquad (1)$$

From equation (1), we can see that it is preferable for voltage $V_{WL}$ of the word line to equal the pumped voltage $V_{CH}$. Capacitance $C_{CH}$ should be of a great enough value to obviate capacitance $C_{WL}$. After charge sharing, the voltage drop of node $V_{CH}$ should be small to secure the stable operation of the circuit in the next cycle. This is achieved by making capacitance CcH great.

Second, in order to set the voltage of a selected word "high", the voltage pumping circuit is kept operating to charge node $V_{CH}$, increasing chip power consumption.

Moreover, the continuous operation of the voltage pumping circuit of FIG. 1C may excessively increase the voltage at node $V_{CH}$ and destroy adjacent transistors.

SUMMARY OF THE INVENTION

It is an object of the present invention to provide a voltage pumping circuit for raising the level of an externally applied voltage within a semiconductor memory device of high complexity and low power consumption.

It is another object of the present invention to provide a voltage pumping circuit for raising the level of an externally applied voltage that enables a high density semiconductor memory device with low power consumption to work under high speed.

It is a further object of the present invention to provide a voltage compensation circuit that immediately compensates for a drop in the output voltage of a voltage pumping circuit conventionally used in a high density semiconductor memory device of low power consumption.

It is still another object of the present invention to provide a voltage compensation circuit that continuously pumps a source supply voltage to a given level to improve the working efficiency of a high density semiconductor memory device.

It is a further object of the present invention to provide a voltage pumping circuit that pumps the level of an externally applied voltage within a semiconductor memory device without increasing chip size.

It is further another object of the present invention to provide a voltage pumping circuit that reduces power consumption in a high density semiconductor memory device.

According to the present invention, a voltage pump is used in a semiconductor memory device which includes an oscillator that generates pulses of a given waveform. The voltage pump comprises an input circuit for responding to pulses from the oscillator, a voltage pumping circuit for producing a voltage raised to a given level in response to an output signal from the input circuit, and a bias circuit for transforming an output signal from the voltage pumping circuit to a source voltage level of the memory device while powering-up the device.

According to one aspect of the present invention, a semiconductor memory device with a voltage pumping node for receiving a voltage pumped to a given level over the operating source voltage of the chip, is provided with a voltage compensation circuit which comprises an input circuit for receiving an enable signal, a voltage pumping circuit for generating a pumped voltage in response to a transition of an output signal from the input circuit, and an output circuit for transferring the pumped voltage from the voltage pumping circuit. A voltage drop of the voltage pumping node is immediately compensated for during the active operation of the memory device such during memory cell enabling and testing.

The enable signal represents any of various signals corresponding to operational modes of the memory device and may be generated by a signal such as a row address strobe (RAS) signal or column address strobe (CAS) signal.

According to another aspect of the present invention, a semiconductor memory device chip includes components which use a raised (pumped) voltage greater than an externally applied source voltage, and comprises a voltage pumping node connected to the raised voltage using components. A voltage pumping circuit is also included for generating a pumping voltage of a given level during powering of the chip. An isolation circuit transfers the pumping voltage to the voltage pumping node. An active kicker compensates for a drop in the pumping voltage in response to an output signal from the raised voltage using components. A detector produces a detection signal in response to the voltage level at the voltage pumping node, the detection signal feeding back at least to the voltage pumping circuit. A clamper is further provided for dropping the raised voltage by the raised amount in response to the detection signal.

The pumping voltage produced by the voltage pumping circuit is precharged to the source voltage level, while the raised voltage is precharged to a level corresponding to the threshold voltage of an isolation transistor. The voltage pumping circuit and active kicker receive the source voltage as an input signal. The active kicker then transfers the raised voltage through another isolation transistor to the raised voltage using components, which isolation transistor transfers an internally prepared pumping voltage as the raised voltage to the raised voltage using components.

DETAILED DESCRIPTION OF THE PREFERRED EMBODIMENTS

Figure 2:
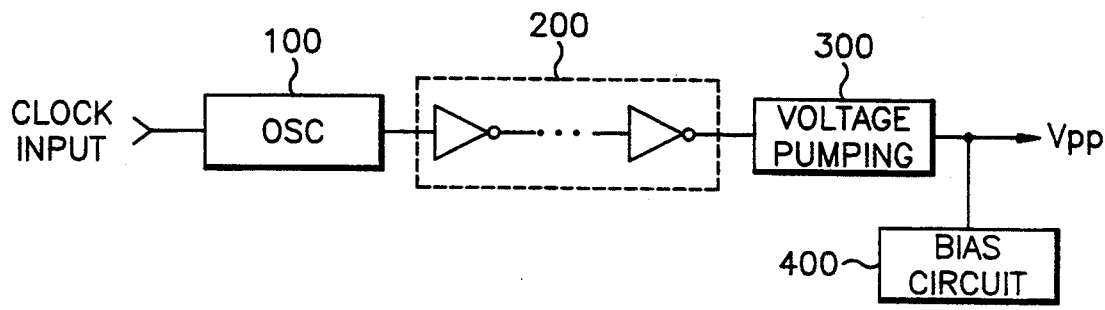
FIG. 2 is a block diagram for illustrating an embodiment of a voltage pumping circuit according to the present invention.

FIG. 2 shows an oscillator control clock signal which is generated simultaneously upon powering of an integrated circuit chip in order to selectively drive an oscillator 100 when a detector (not shown) detects a voltage Vpp to be of an insufficient level.

Oscillator 100 generates a pulse signal whose voltage is amplified through driver circuit 200. The amplified pulse signal is transferred to voltage pumping circuit 300 to produce a predetermined pumped voltage Vpp.

Bias circuit 400 precharges an output terminal of voltage pumping circuit 300 with source voltage level Vcc simultaneously upon powering the chip. Driver circuit 200 serves to generate a more efficient voltage pumping signal Vpp.

Figure 3A:
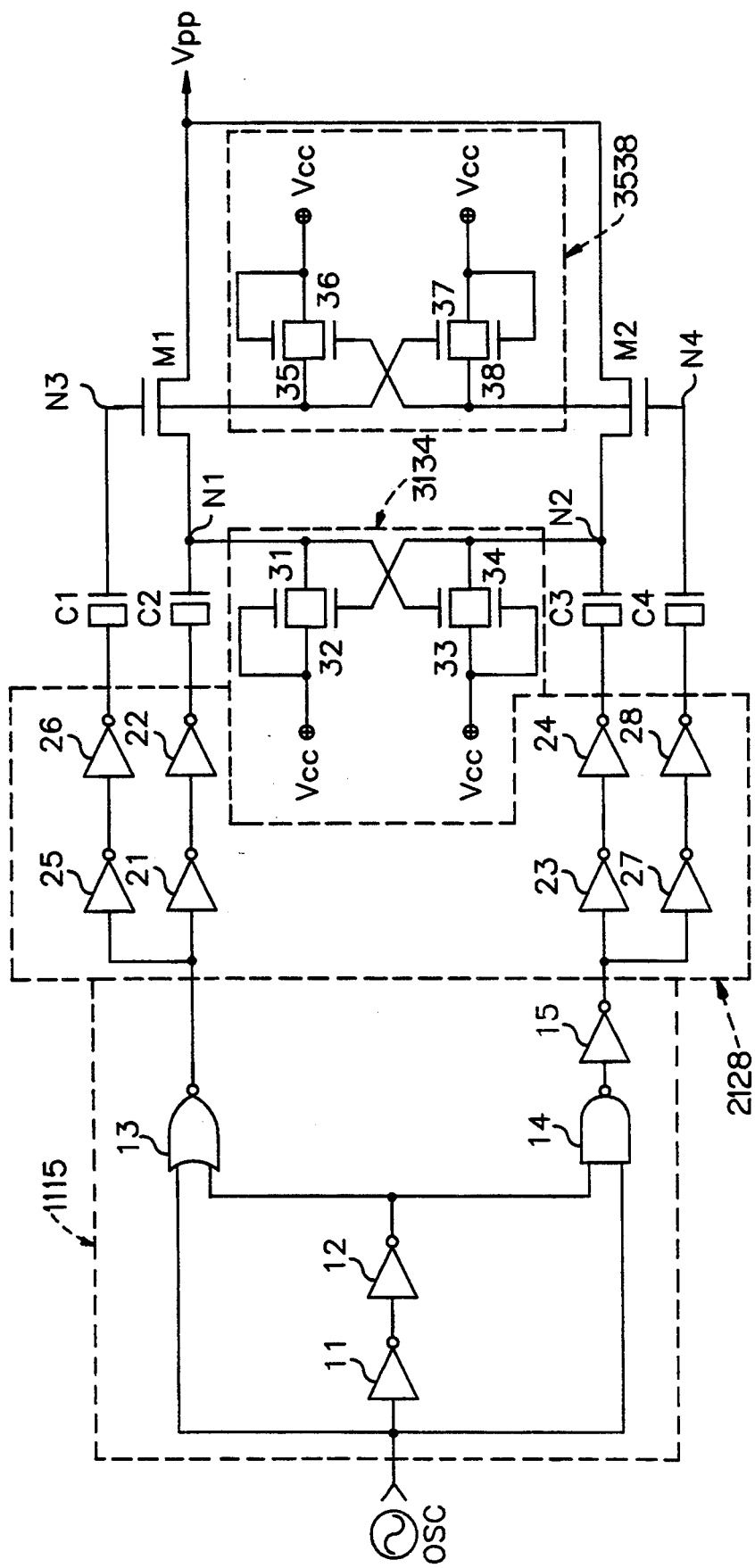
FIG. 3A is a circuit diagram for showing a specific embodiment of FIG. 2.

A preferred embodiment of FIG. 2 is shown in FIG. 3A. Input circuit 1115 comprises NOR-gate 13 and NAND-gate 14. The output signal of input circuit 1115 is voltage-amplified through driver circuit 2128. The output signals of driver circuit 2128 are connected to capacitors C1, C2, C3, C4 of a voltage pumping circuit. Capacitors C2 and C3 are respectively connected to the channels of first and second transfer transistors M1 and M2.

The electrodes of capacitors C2 and C3 face the channels of transfer transistors M1 and M2 and are supplied with source voltage Vcc from first bias circuit 3134. The gates of first and second transfer transistors M1 and M2 are supplied with source voltage Vcc from second bias circuit 3538.

The operation of the circuit of FIG. 3A is now specifically described with reference to FIG. 3B. It should be noted that voltage Vpp is continuously pumped regardless of the output level of the oscillator as "high" or "low". In addition, inverters 25, 26 and capacitor C1 are disposed between the output terminal of NOR-gate 13 and the gate of first transfer transistor M1. Inverters 27, 28 and capacitor C4 are disposed between inverter 15, which is connected to the output terminal of NAND-gate 14, and the gate of the second transfer transistor M2.

Second bias circuit 3538 is coupled therewith to maximize the efficiency of the voltage pumping circuit according to the present invention. When the chip is first powered up, nodes N1 and N2 are initialized or precharged with a supply source voltage level (Vcc: Precisely speaking, this will be Vcc-Vth level, but accomplished with Vcc level by replacing the components of first bias circuit 3134 with P-type MOS transistors).

Figure 3B:
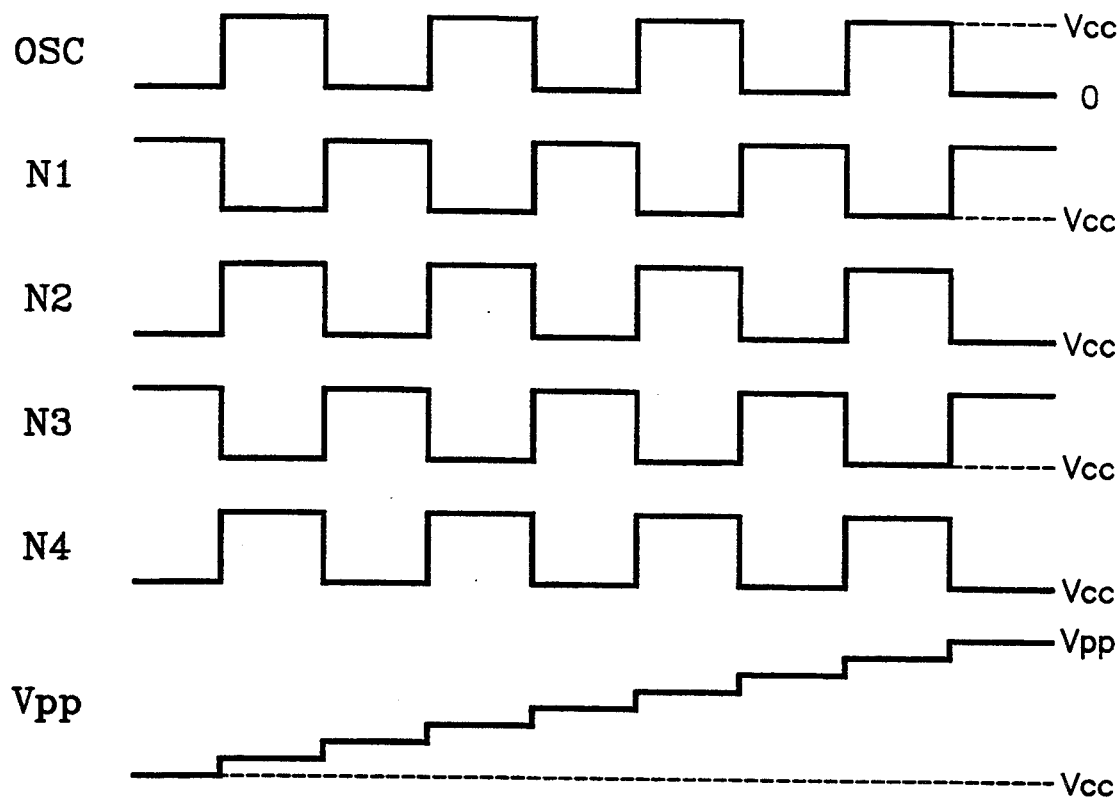
FIG. 3B is a timing diagram for showing the operation of the circuit as shown in FIG. 3A.

If an oscillator signal is provided as shown in FIG. 3B, nodes N1 and N2 will have opposite voltage levels triggered from Vcc to 2Vcc (this is accomplished by the coupling effect of capacitors C2 and C3).

Nodes N3 and N4 are also triggered from Vcc level to 2Vcc level by the charge coupling effect of capacitors C1 and C4. Accordingly, voltage Vpp is gradually pumped from an initial Vcc level to a 2Vcc level by charge sharing of first and second transfer transistors M1 and M2, as shown in FIG. 5.

In the present embodiment, because NOR-gate 13 and inverter 15 have opposite output levels, the turning-on operations of first and second transfer transistors M1 and M2 are oppositely performed to continuously pump voltage Vpp to level 2Vcc. In addition, because the gates of first and second transfer transistors M1 and M2 are continuously supplied with voltage Vcc by second bias circuit 3538, the channels of first and second transfer transistors M1 and M2 are fully turned on when node N1 or N2 is in the 2Vcc level, thus further improving the pumping efficiency of a voltage Vpp signal.

Furthermore, voltage Vpp is generated to a predetermined level, i.e. 2Vcc, before enabling of the chip, thereby providing high speed operation.

In the circuit shown in FIG. 3A, a highly pumped voltage is obtained even at a considerably low operating source voltage Vcc for the chip. As a result, Vpp voltage can have a value of 4.5V or more at a Vcc voltage of 3V.

Figure 3C:
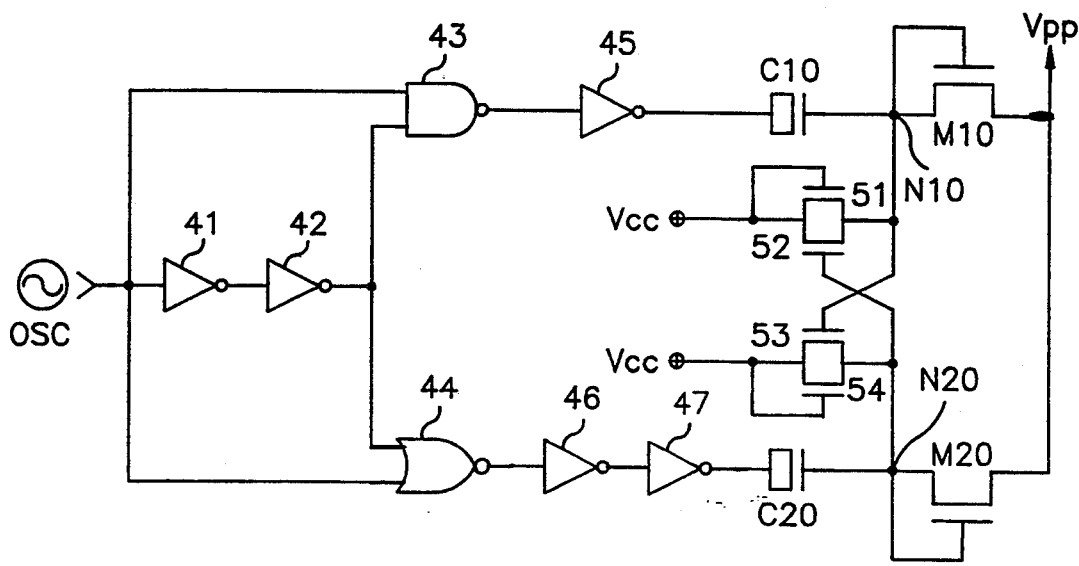
FIG. 3C is a circuit for showing another specific embodiment of FIG. 2.

The circuit of FIG. 3C is substantially similar to the circuit of FIG. 3A except for the first and second transfer transistors M10 and M20 being diode-connected.

In FIG. 3C, the inverters 25, 26 and capacitor C1 connected to the gate of the first transfer transistor M1, the inverters 27, 28 and capacitor C4 connected to the gate of the second transfer transistor M2, and the second bias circuit 3538, have been eliminated (compare with FIG. 3A). The operational characteristics of FIG. 3C, however, are similar to the circuit of FIG. 3A.

The voltage at node N10 or N20 is pumped to level 2Vcc to turn on first or second transfer transistor M10 or M20, thus raising the Vpp voltage to a predetermined level.

The circuit of FIG. 3C is simple enough as to be viably integrated in a high density integrated circuit. The technical concept of the present invention, shown in FIG. 2, may be realized in a variety of embodiments in addition to the circuits of FIGS. 3A and 3C.

For example, input circuit 1115 may take any form provided it only generates logically different responses to the output waveform of oscillator 100, and that first and second bias circuits supply a level Vcc (or Vcc-Vth) voltage.

Figure 4:
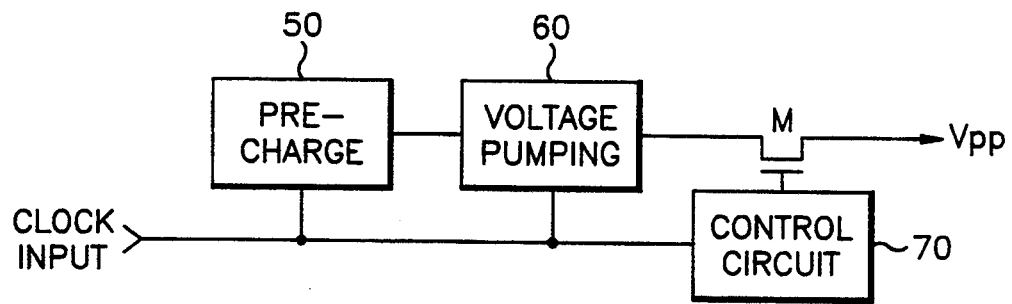
FIG. 4 is a block diagram for illustrating a second embodiment of a voltage pumping circuit according to the present invention.

In FIG. 4, an enable signal is shown applied to a source voltage precharge circuit 50 and to a control circuit 70 coupled to an output circuit M. The Vpp signal is transferred from a channel of output circuit M coupled to an output terminal of a voltage pumping circuit (i.e. Vpp voltage generator) provided in the chip.

The source voltage precharge circuit 50, which improves the efficiency of voltage pumping circuit 60, causes voltage pumping circuit 60 to pump the output voltage to a predetermined level, and initially precharges the voltage pumping circuit 60 with source voltage Vcc when the circuit of FIG. 4 is disabled.

The control circuit 70 controls the output circuit M to perform the output operation only when the voltage of pumped voltage Vpp is dropped before being applied to any receiving chip components.

The output circuit also serves to prevent the pumped voltage Vpp (i.e. the voltage generated by the voltage pumping circuit provided in the chip) from reversely conducting into voltage pumping circuit 60 when the circuit of FIG. 4 is disabled.

In this particular embodiment, output circuit M consists of an N-type MOS transistor, but may take any other form to transfer raised voltage Vpp.

Figure 5A:
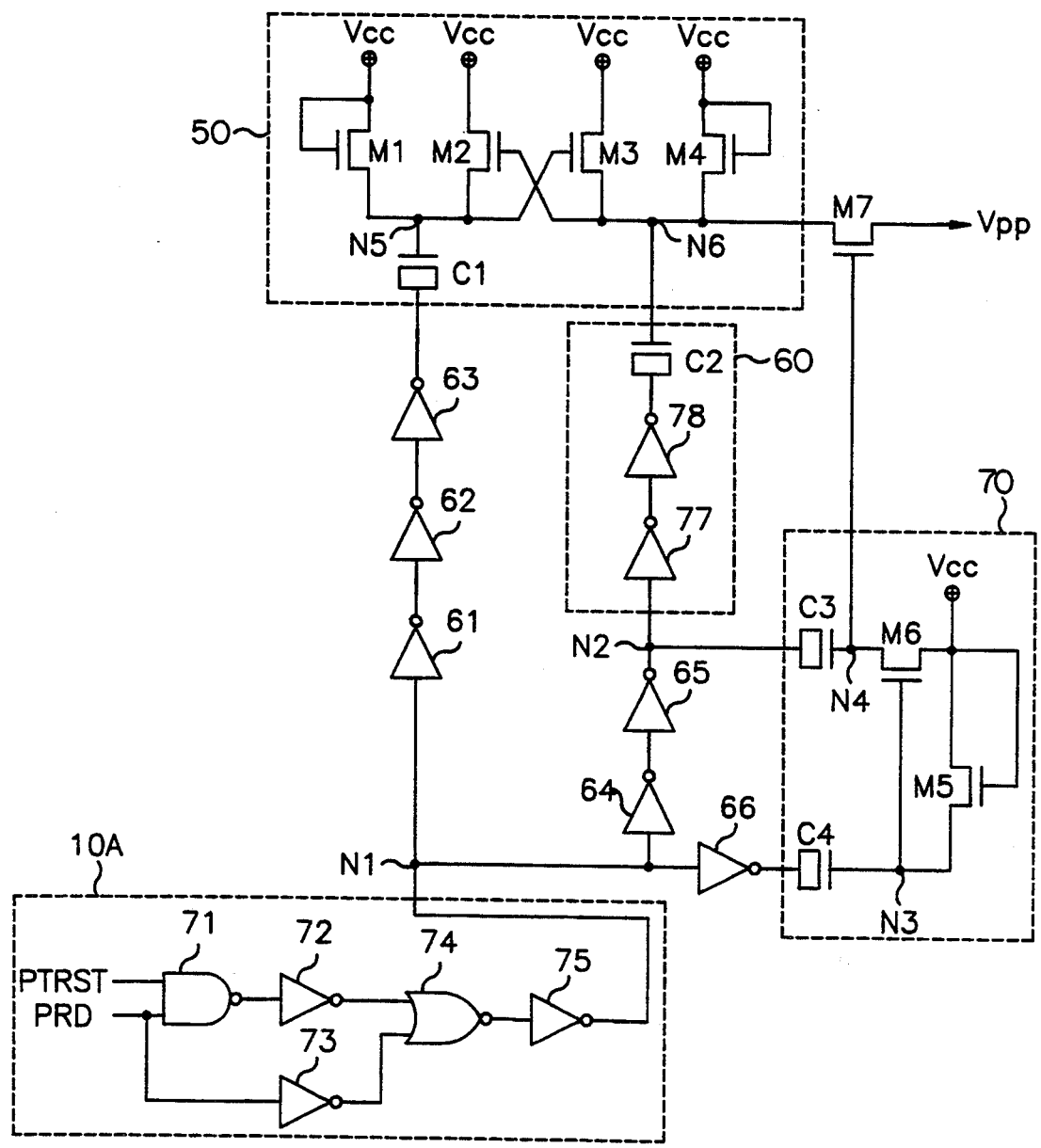
FIG. 5A is a circuit for showing a specific embodiment of FIG. 4.
Figure 5B:
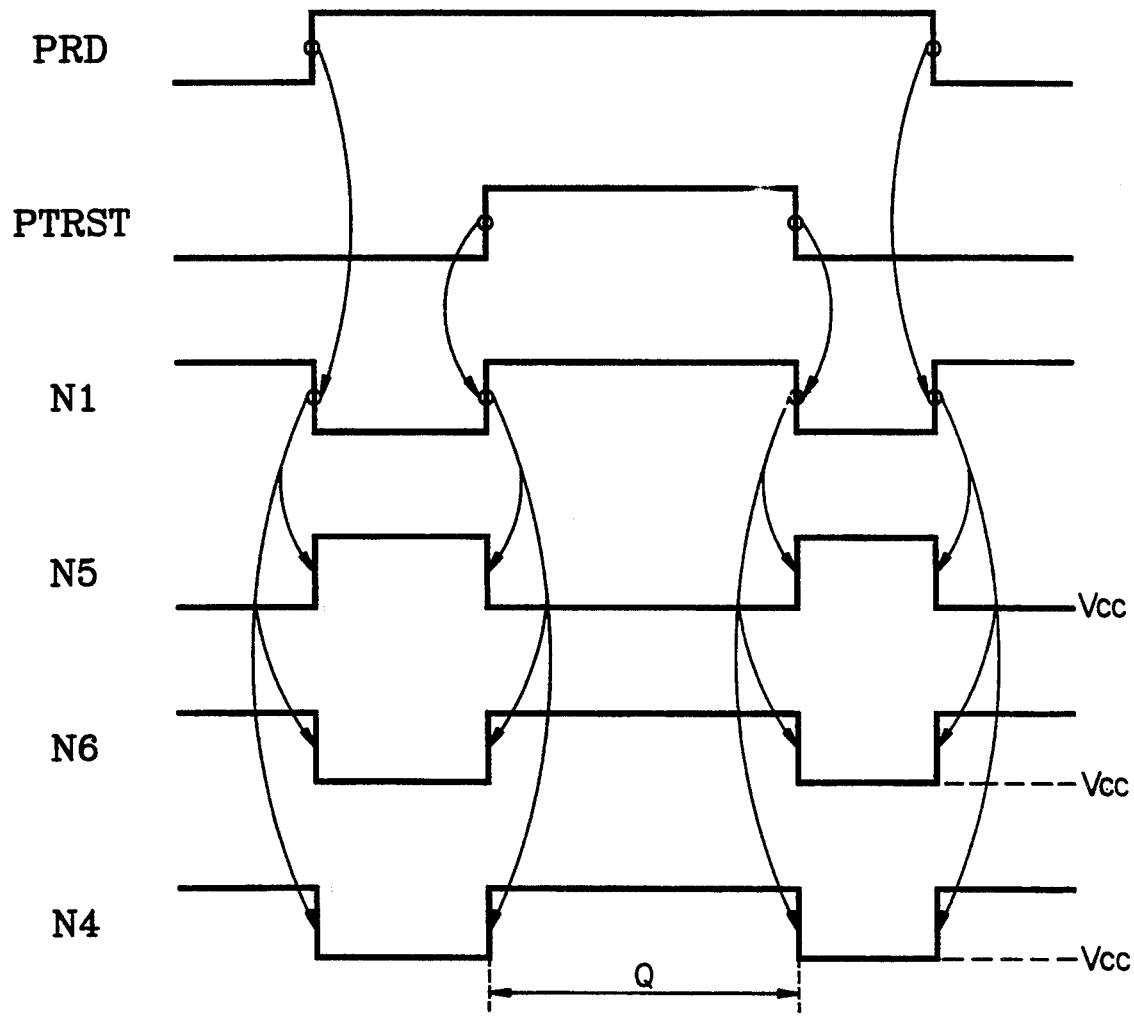
FIG. 5B is a timing diagram for showing the operation of the circuit shown in FIG. 5A.
Figure 5C:
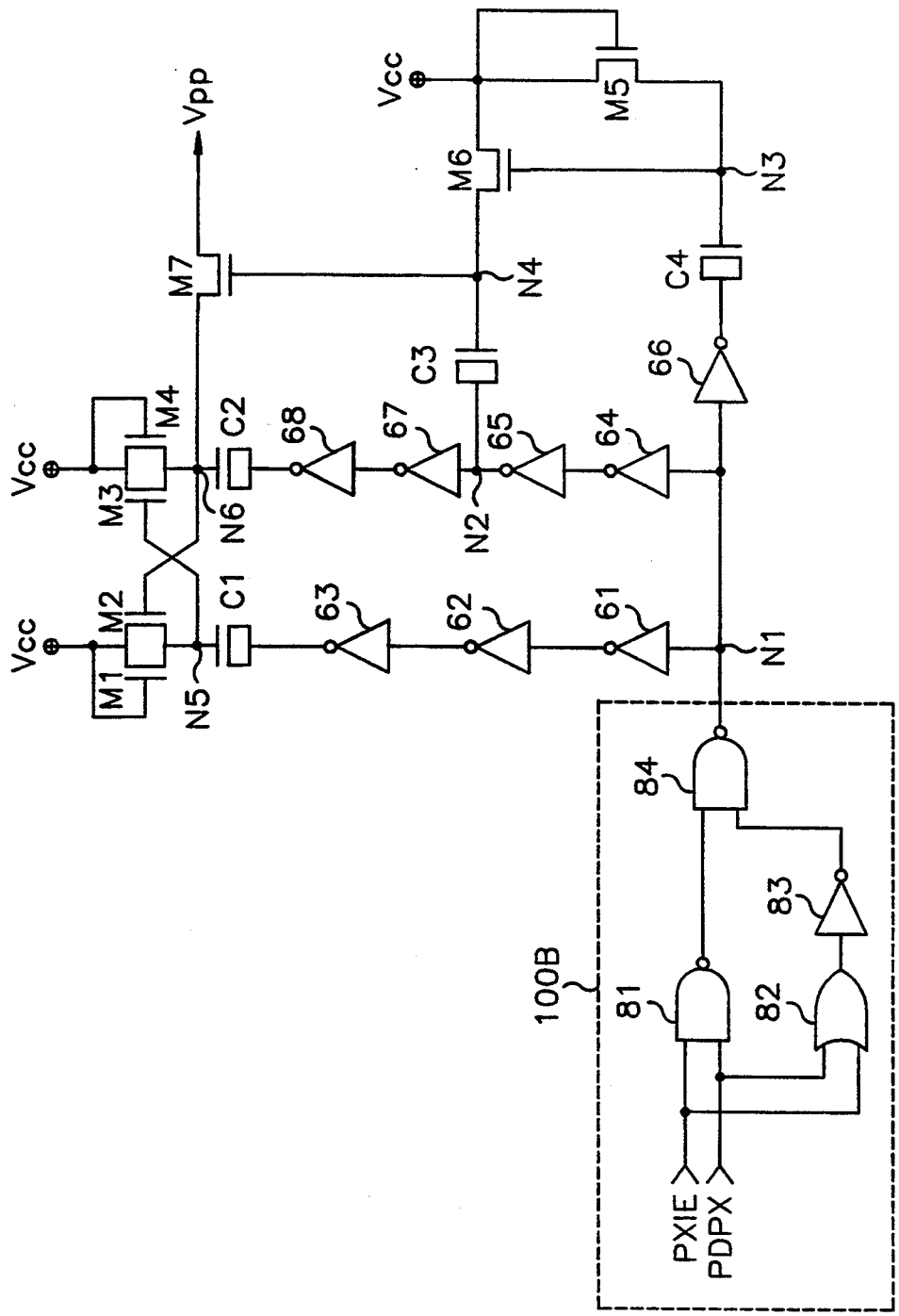
FIG. 5C is a circuit for showing another specific embodiment of FIG. 4.
Figure 5D:
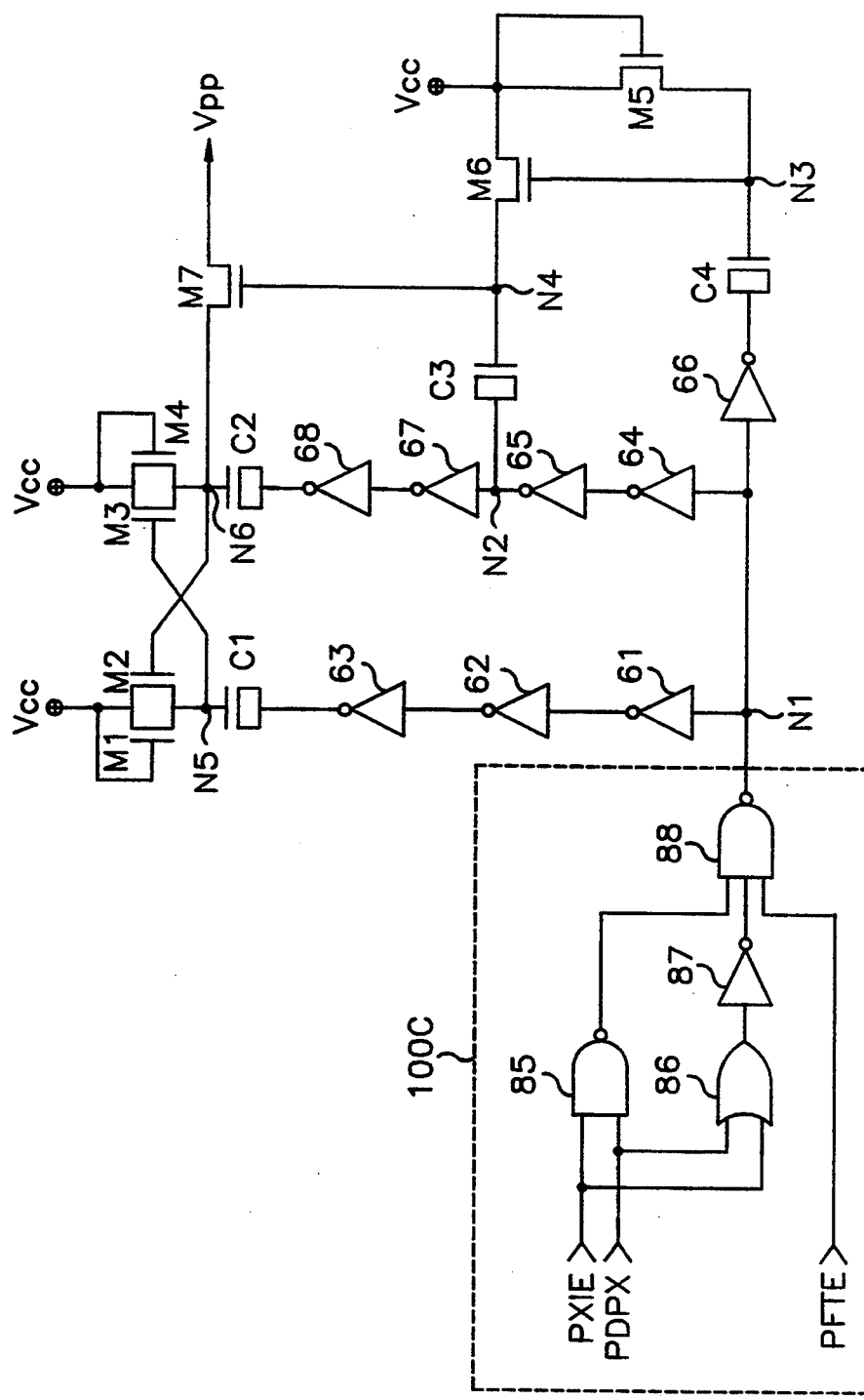
FIG. 5D is a circuit for showing a further specific embodiment of FIG. 4.

There are shown specific embodiments of the circuit of FIG. 4 in FIGS. 5A, 5C and 5D. The circuits of FIGS. 5A, 5C and 5D have different input circuits in response to various kinds of enable signals and operational modes of the chip. Namely, the active operation of the chip includes a variety of modes such as data read/write, chip test, etc., and the respective enable signals are set variously. Hence, the circuits of FIGS. 5A, 5C and 5D are provided to compensate for a voltage drop occurring in various active operation modes.

The circuit of FIG. 5A comprises an input circuit 10A for supplying an enable signal, source voltage precharge circuit 50 coupled to the output signal of the input circuit 10A, voltage pumping circuit 60 coupled to the output signal of the input circuit 10A for raising the output signal voltage of the source voltage precharge circuit 50, output circuit M7 for transferring the raised voltage of the voltage pumping circuit 60, and output control circuit 70 for controlling the operation of the output circuit M7.

Inverters 61-66 are used to logically interconnect circuit elements. Input circuit 10A consists of NAND-gate 71 with two inputs respectively receiving two enable signals PTRST and PRD, NOR-gate 74 with one input receiving the enable signal PRD via inverter 73 and the other input receiving the output signal of NAND-gate 71 via inverter 72, and inverter 75 connected to the output of NOR-gate 74.

The source voltage precharge circuit 50 comprises first voltage pumping capacitor C1, first pull-up transistor M1, second pull-up transistor M2, third pull-up transistor M3 and fourth pull-up transistor M4. One electrode of the capacitor C1 is connected to the output signal of input circuit 10A via series inverters 61, 62, 63.

First pull-up transistor M1 has its gate connected to the source voltage Vcc, with its source-drain connecting source voltage Vcc to the other electrode of the first capacitor C1.

Second pull-up transistor M2 has its gate connected to an output node N6, with its source-drain channel connection source voltage Vcc to the said other electrode of the first capacitor C1.

Third pull-up transistor M3 has its gate connected to the said other electrode of the first capacitor C1, with its source-drain in channel connecting voltage source Vcc to output node N6.

Fourth pull-up transistor M4 has its gate connected to the voltage source Vcc, with its source-drain channel connecting voltage source Vcc to output node N6.

The voltage pumping circuit 60 includes second voltage pumping capacitor C2 having one electrode coupled to the output signal of input circuit 10A via inverters 64, 65 and driver circuit stage 77, 78 for improving the voltage pumping efficiency.

The output control circuit 70 comprises a third pumping capacitor C3 having one electrode coupled to the output signal of the input circuit 10A via inverters 64, 65, a fourth pumping capacitor C4 having one electrode coupled to the output signal of the input circuit via inverter 66, a fifth pull-up transistor M5 having its gate connected to source voltage Vcc, and its source-drain channel connecting source voltage Vcc to the other electrode of the fourth capacitor C4, and a sixth pull-up transistor M6 having its gate also connected to the said other electrode of the fourth capacitor C4.

The source-drain channel of the sixth pull-up transistor M6 connects source voltage Vcc to the other electrode of third capacitor C3 and also to a control terminal of output circuit M7.

The output node N6 of the voltage pumping circuit 60 transfers the pumped voltage Vpp and is fed back to the control terminal of the second pull-up transistor M2. The enable signals PTRST and PRD perform transition respectively when the column and row address signals are produced as the active signals.

The operational characteristics of the circuit of FIG. 5A are described with reference to the timing diagram of FIG. 5B. The enable signals PTRST and PRD are produced in "low" state as shown in FIG. 5B when they do not perform the transition (or the chip is not in the active operation).

The timing diagram of FIG. 5B represents timing operations after the circuit of FIG. 5A is activated. As the circuit of FIG. 5A is disabled, nodes N6 and N4 are all precharged with source voltage Vcc, node N1 for receiving the output signal of the input circuit 10A is precharged with ground voltage, node N5 of source voltage precharge circuit 50 is at voltage 2Vcc, and output node N6 is at source voltage Vcc.

Node N4 has also been precharged to voltage Vcc and is connected to the control terminal of output circuit M7.

Thereafter, before the chip is reactivated, node N5 of source voltage precharge circuit 50 is precharged to source voltage Vcc, node N6 set to voltage pumping circuit 50 with 2Vcc, node N3 of output control circuit 70 is precharged to voltage Vcc and node N4 set to 2Vcc, and applied to the control terminal of output circuit M7.

As enable signal PRD is first raised to high" level (the enable signal PRD is a delayed signal generated after a row address strobe signal (RAS) is produced as an active signal), the voltage level at node N1 goes "low" and accordingly, node N5 becomes voltage 2Vcc and nodes N6 and N4 voltage Vcc. In this particular situation, node N6 has full-Vcc voltage level via third pull-up transistor M3 being fully turned on by the voltage node N5 being set to 2Vcc, node N6 being pumped fully to level 2Vcc level as node N1 and goes "high".

Meanwhile, output circuit M7 is turned off to indicate that the chip is activated to apply a Vpp voltage to the components of the chip (i.e. the components such as word line driver, data output driver, etc.). Then when the enable signal PTRST goes "high" with enable signal PRD also maintained at "high" level, node N1 transits "high" causing nodes N5, N6, and N4, respectively, to have voltages Vcc, 2Vcc and 2Vcc.

The Vpp voltage is used as the operating voltage of the chip, thus suffering a voltage drop. At this time, output circuit M7, whose control terminal is applied with voltage 2Vcc and its channel charged to a voltage 2Vcc at one end, is turned on to quickly compensate for a Vpp voltage drop. Thus, components in the chip receiving Vpp maintain stable operating voltages without compromising operational speed.

When the enable signal PTRST goes "low", node N1 again also goes "low" setting node N5 to voltage 2Vcc and nodes N6 and N4 to voltage Vcc level. As a result, Vpp voltage level is prevented from reversely conducting through output circuit M7.

Subsequently, when enable signal PRD goes low, all components have been precharged to an initial value and a drop in Vpp voltage is properly compensated.

In FIG. 5B, interval Q, corresponding to the time when Vpp voltage is substantially bootstrapped, may be properly adjusted according to the further characteristics of the chip by controlling the period of enabling signals or by providing a voltage pumping circuit 60 with delay capability.

The circuit of FIG. 5C is similar to that of FIG. 5A except for enable signals input to input circuit 100B and for the construction of logic gating thereof.

Enable signal PXIE serves to control pumped voltage Vpp of a voltage pumping circuit to be applied to a given word line, and the enable signal PDPX is produced in response to an RAS signal transition or an address decoding related transition.

Input circuit 100B includes a first NAND-gate 81 and an NOR-gate 82 each with two inputs respectively receiving the two enable signals PXIE and PDPX, and a second NAND-gate 84 for receiving the output of NOR-gate 82 via inverter 83. Node N1 for receiving the output signal of input circuit 100B is initially set "high" as in FIG. 5A. Remaining circuits also operate substantially as in the circuit of FIG. 5A. Enable signals PXIE and PDPX are familiar clock signals widely found associated in a variety of operational modes relating to dynamic RAMs.

The circuit of FIG. 5D shows an additional enable signal PFTE of input circuit 100C provided to a circuit as in FIG. 5C. Three-input NAND-gate 88 receives enable signal PFTE to generate an output at node N1. Enable signal PFTE is enabled when a memory chip is to operate in the test mode. The circuit of FIG. 5D also works in the same manner as that of FIG. 5C, the node N1 being precharged with voltage "high" level.

The circuits of FIGS. 5A, 5C and 5D have different uses in accordance with various operational modes of the chip and therefore may all be provided in the chip to collectively accomplish the objects of the present invention. Of course, various modifications to the circuits may be made without departing from the spirit of the present invention.

Figure 6:
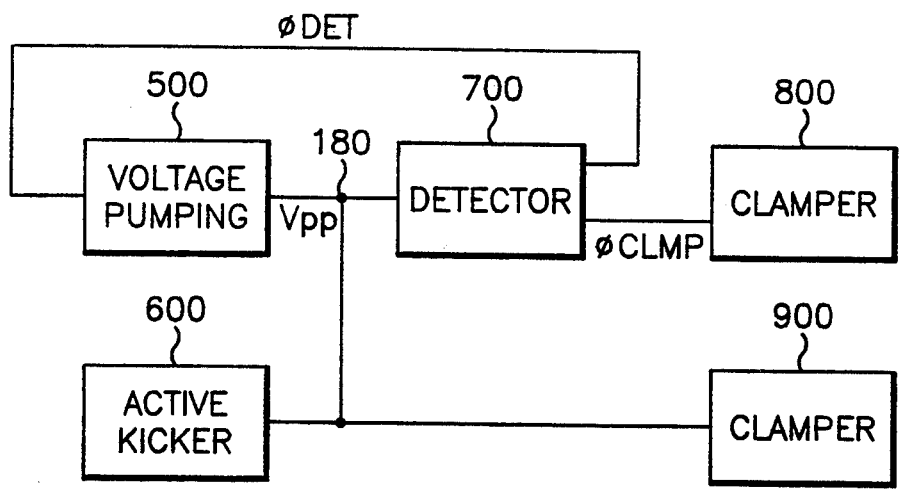
FIG. 6 is a block diagram for illustrating a third embodiment of a voltage pump according to the present invention.

FIG. 6 shows yet a further embodiment of the present invention. A voltage pumping device is shown which comprises a pumping circuit 500 for producing a pumped voltage Vpp, active kicker 600 for voltage compensating during a drop in the pumped voltage Vpp, detector 700 for detecting the level of the pumped voltage Vpp, and first and second clamper 800 and 900 for preventing the pumped voltage Vpp from being raised over a given level.

Figure 7A:
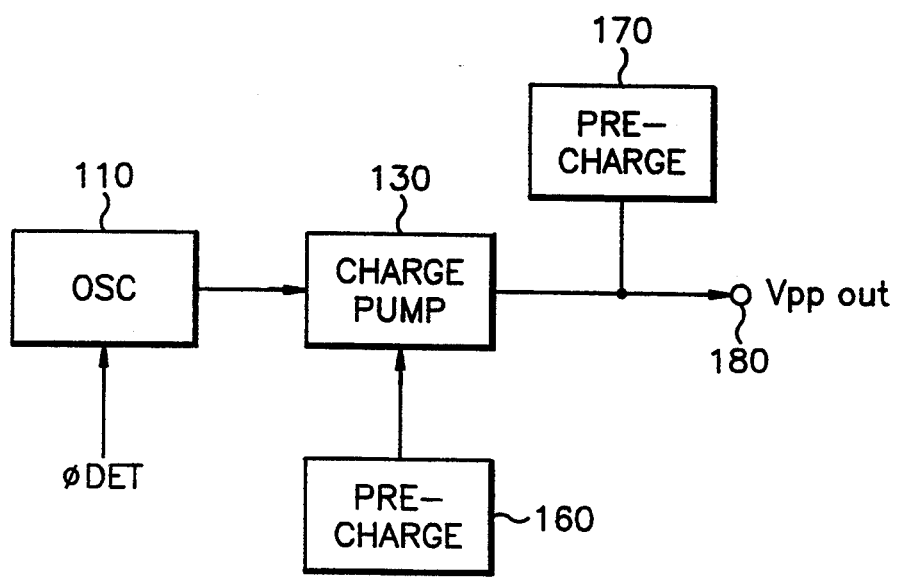
FIG. 7A is a circuit for showing a block embodiment of the voltage pumping circuit of FIG. 6.
Figure 7B:
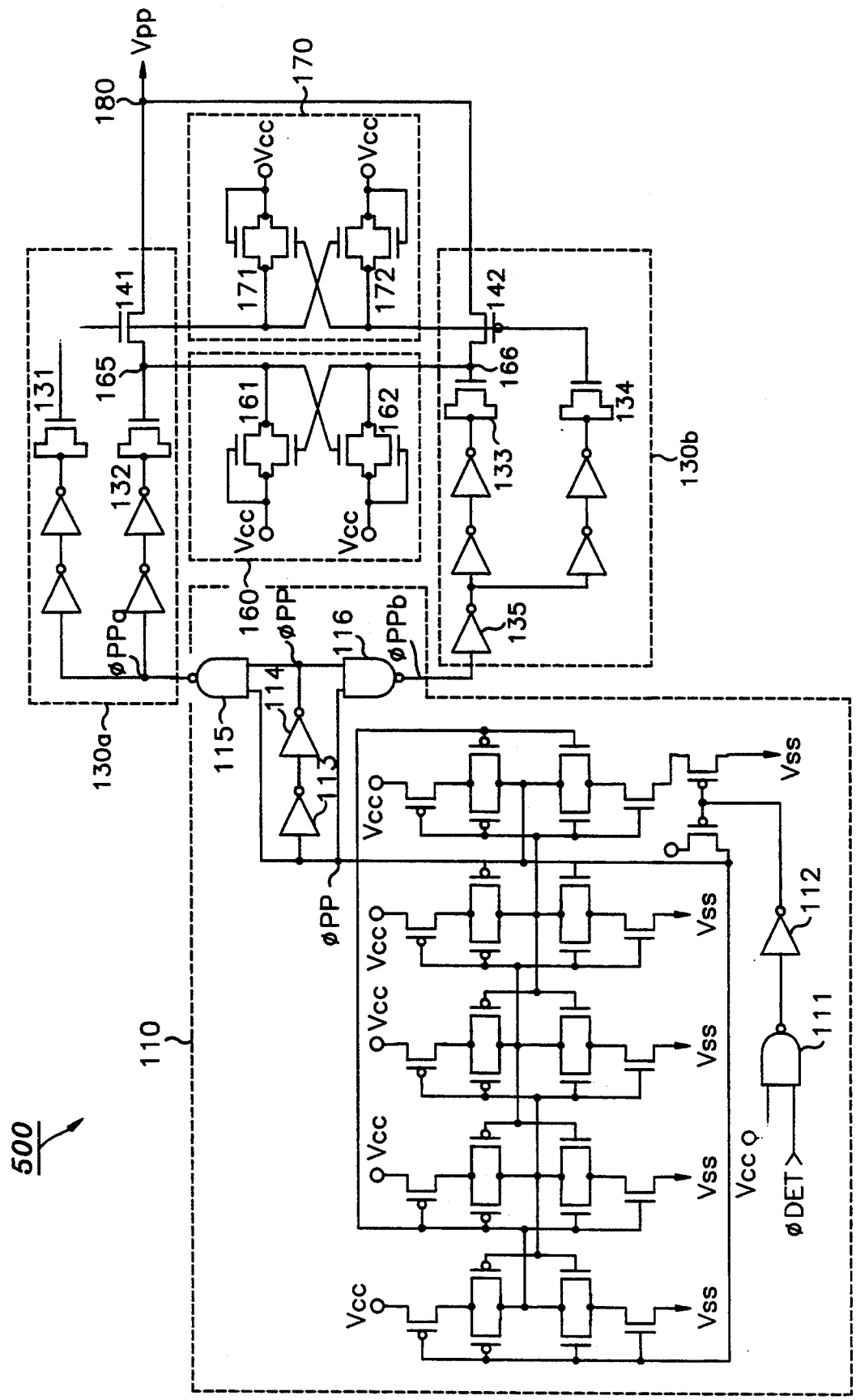
FIG. 7B is a circuit for showing a specific embodiment of the voltage pumping circuit of FIG. 7A.

The pumping circuit 500 comprises, as shown in FIG. 7A and FIG. 7B, an oscillator 110 for generating pumping clock pulses ΦPP in response to the level detection signal ΦDET from detector 700, charge pump 130 for producing a pumped voltage Vpp in response to pumping clock pulses ΦPP, first precharge circuit 160 for precharging the pumping node of the output of the charge pump 130 with Vcc before a pumping operation, isolation transistors 141, 142 for transferring the voltage of the pumping node to the Vpp node 180, and second precharge circuit 170 for precharging the gates of the isolation transistors 141, 142 with Vcc before the pumping operation.

FIG. 7B illustrates with greater detail the circuit of FIG. 7A. Charge pump 130 comprises a first charge pump circuit 130a driven during a "high" state of pumping clock pulses ΦPP and second charge pump circuit 130b driven during a "low" state of pumping clock pulses ΦPP. First precharge circuit 160 includes two transmission gates 161 and 162 connected in latch configuration between source voltage Vcc and first and second pumping nodes 165 and 166.

Similarly, second precharge circuit 170 includes two transmission gates 171 and 172 performing a latching operation to provide the respective gates of isolation transistors 141 and 142 with source voltage Vcc.

Isolation transistors 141 and 142, which are shown as NMOS transistors in the present embodiment, transfer voltages from first and second pumping nodes 165 and 166 to Vpp node 180. First and second precharge circuits 160 and 170 work to simultaneously raise the voltages of pumping nodes 165 and 166 and the gates of isolation transistors 141 and 142 from voltage Vcc level.

Pumping clock pulses ΦPP are pulse width adjusted by way of inverters 113, 114 and NAND-gate 115 and changed to first pumping clock pulses ΦPPa which are supplied to first and second pumping MOS capacitors 131 and 132 of first charge pump circuit 130a which are respectively connected to the gate and drain of first isolation transistor 141.

Furthermore, pumping clock pulses ΦPP are pulse width adjusted by way of inverters 113, 114 and NAND-gate 116 and changed to second pumping clock pulses ΦPPb supplied via inverter 135 to third and fourth MOS capacitors of second charge pump circuit 130b which are respectively connected to the drain and gate of second isolation transistor 142.

Thus, when pumping clock pulses ΦPP are low, first and second pumping MOS capacitors 131 and 132 work to charge the Vpp node 180 to voltage 2Vcc. When pumping clock pulses ΦPP are high, third and fourth pumping MOS capacitors 133 and 134 serve to raise the voltage level at Vpp node 180 that has already been charged to voltage 2Vcc by way of first charge pump circuit 130a.

Figure 1A:
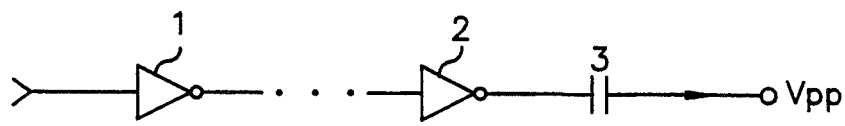
FIG. 1A is a block diagram for illustrating an embodiment of a voltage pumping circuit according to the prior art.
Figure 1B:
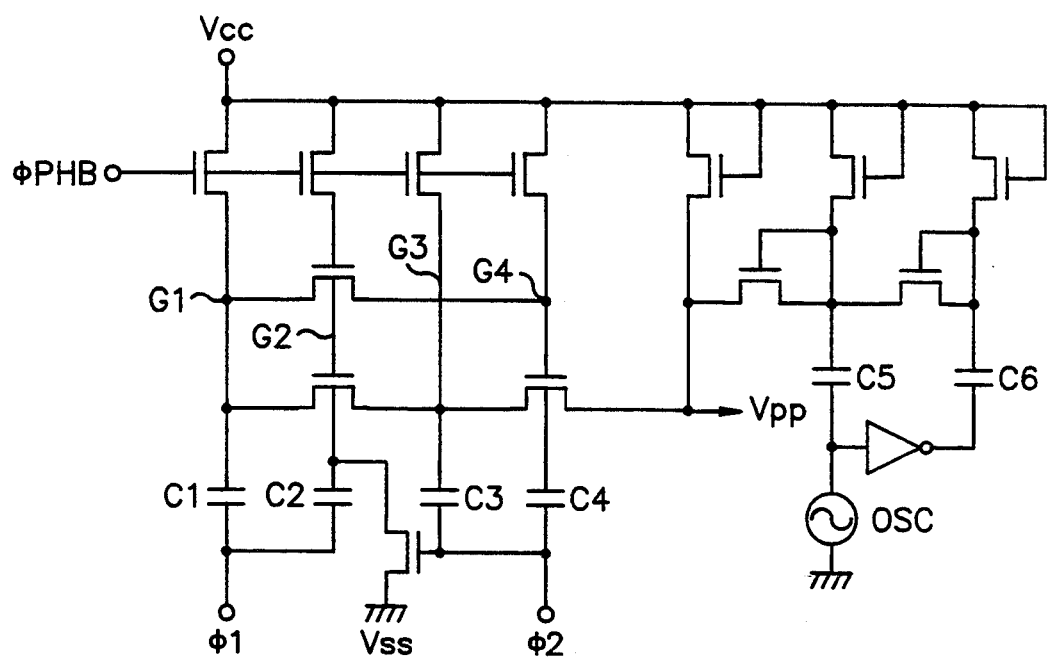
FIG. 1B is a circuit diagram for illustrating another embodiment of a voltage pumping circuit according to the prior art.

Because pumping circuit 500 supplies the pumped voltage Vpp to first and second isolation transistors 141 and 142 and on a word line driver or bit line separation gate, it obviates the need for a separate capacitor as provided in the conventional circuits shown in FIG. 1.

Moreover, a pumped voltage Vpp is supplied to the separation gate of a bit line such that N-type and P-type sense amplifiers may be commonly employed obviating the need to provide an additional circuit for raising the voltage applied to the separation gate as in conventional circuits. This serves to reduce chip size and increase chip density.

If the voltage level of Vcc applied to the NAND-gate to drive the oscillator is not pumped over a given value (i.e. it is not in the operating state), pumping circuit 500 does not work and therefore the operating and standby current of the chip is not substantially increased, thus reducing power consumption during non-pumping cycles of operation.

Active kicker 600 compensates for a voltage drop in the pumped voltage Vpp which results from the pumped voltage Vpp of pumping circuit 500 being repeatedly supplied to a word line driver or separation gate (that is, the gate of a transistor for transferring data between data lines).

Figure 7C:
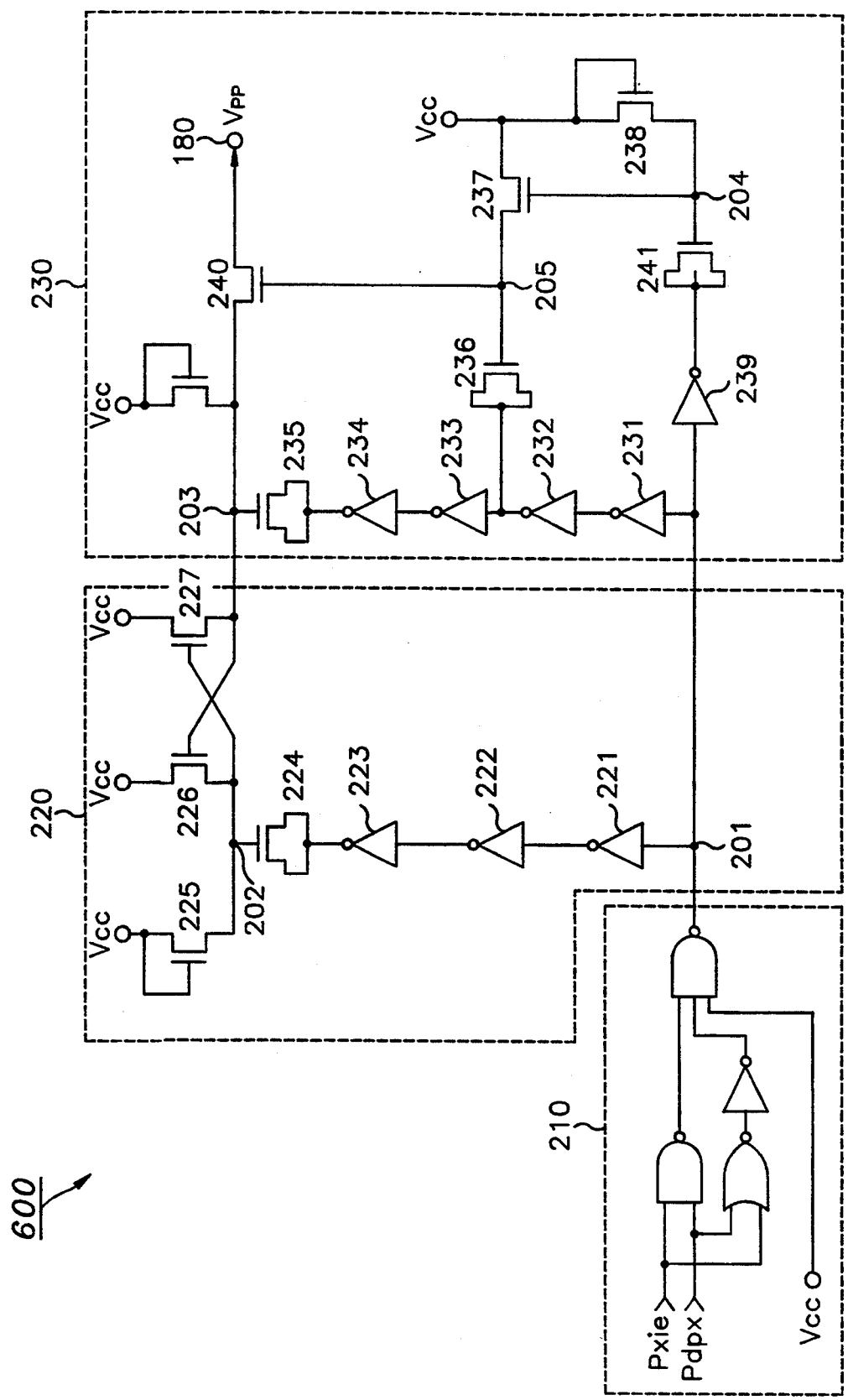
FIG. 7C is a circuit for showing a specific embodiment of the active kicker of FIG. 6.

As shown in FIG. 7C, active kicker 600 comprises an exclusive OR (XOR) circuit 210 for receiving the clock pulses Pxie, Pdpx and source voltage Vcc, re-kicker 220 operated at the output of the XOR circuit 210 being "low", and kicking driver 230 operated at the output of the XOR circuit 210 being "high". The signals Pxie and Pdpx are used to drive selected word lines of a conventional memory array.

In pre-kicker 220, the output of the XOR circuit 210 is supplied to first node 201 which in turn is connected with second node 202 via three cascaded inverters 221, 222, 223 and kicking capacitor 224. Between second and third nodes 202 and 203, there are arranged NMOS transistors 226 and 227 with cross-coupled gates and drains connected to source voltage Vcc. Transistors 226 and 227 serve to precharge third node 203 with full level voltage Vcc by employing the voltage at second node 202. Between first and third nodes 201 and 203, there are connected in series four inverters 231, 232, 233, 234 and second kicking capacitor 235. A first node 201 is connected with fourth node 204 via inverter 239 and third kicking capacitor 241. Fourth node 204 is charged with voltage Vcc-Vth level by way of NMOS transistor 238 connected to source voltage Vcc. Also, fourth node 204 is connected to the gate of a precharge NMOS transistor 237 whose drain is connected to source voltage Vcc.

The source of NMOS transistor 237 also is connected to fifth node 205. Between inverter 232 and fifth node 205 is connected fourth kicking capacitor 236. Vpp node 180 is connected to the source of third isolation transistor 240 whose gate and drain are respectively coupled to fifth and third nodes 205 and 203.

Figure 7D:
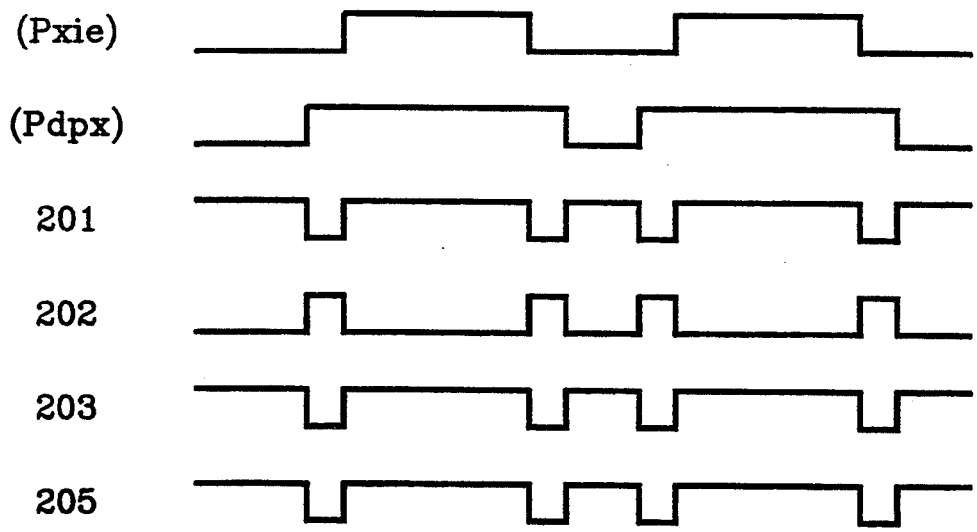
FIG. 7D is a timing diagram for illustrating the operation of the active kicker of FIG. 7C.

As shown in FIG. 7D which is based on FIG. 7C, when first node 201 connected to the output of XOR circuit 210 is in "low" state, the three inverters 221, 222, 223 and first kicking capacitor 224, connected in series to first node 201, work to raise the voltage level at second node 202 from Vcc-Vth (precharged by means of the NMOS transistor 225) to 2Vcc-Vth. This causes NMOS transistors 226 and 227 to charge the third node 203 with full Vcc level.

Because the voltage level at fourth node 204 is raised from Vcc-Vth to 2Vcc-Vth when the first node 201 is in "low" state, fifth node 205 is charged with full Vcc level via NMOS transistor 237. Thereafter, when the voltage level of the first node 201 becomes "high", the voltage level of third node 203 is raised from Vcc level to 2Vcc level by the operation of fourth kicking capacitor 236.

Fourth kicking capacitor 236 serves to raise the voltage level of fifth node 205 from Vcc level to 2Vcc level. In this situation, isolation transistor 240 supplies 2Vcc to the Vpp node 180. In this active kicker 600, because source voltage Vcc is one input to XOR circuit 210, it will not drive the circuit below a given level as is possible in the pumping circuits discussed above 100.

In addition, because signals Pxie and Pdpx are produced from a circuit using the pumped voltage Vpp (e.g., a word line driver), a drop in the pumped voltage Vpp may be compensated by way of the above procedure.

The number of active kickers used on a chip is proportional to the number of circuits using pumped voltage Vpp.

Figure 7E:
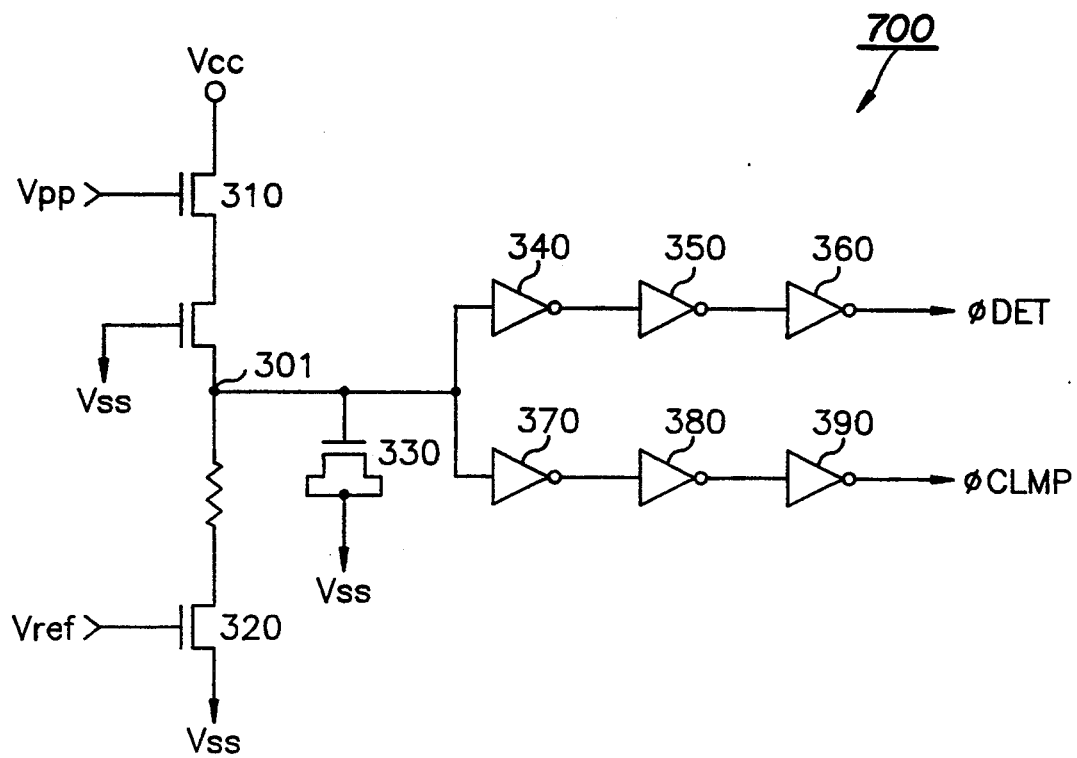
FIG. 7E is a circuit for showing an embodiment of the detector of FIG. 6.

As shown in FIG. 7E, the pumped voltage Vpp is applied to the gate of NMOS transistor 310 and is level detected. Hence, the threshold voltage of the NMOS transistor 310 connected between source voltage Vcc and detection node 301 should be set to a value that turns the transistor on and off in response to the gate voltage being over or below 2Vcc, respectively, assuming a pumped voltage Vpp value of 2Vcc.

The method for setting a threshold voltage for the NMOS transistor is well-known in this art and therefore will not be described.

Between detection node 301 and ground voltage Vss, there is provided an NMOS transistor 320 whose gate is connected to a reference voltage Vref. Assuming a constant resistance between detection node 301 and ground voltage Vss of Rref, and assuming a constant resistance between source voltage Vcc and detection node 301 of Rpp (varied according to the level of the pumped voltage Vpp), the voltage at detection node 301 is given by the ratio Rref/(Rpp+Rref).

Thus, if the level of the pumped voltage Vpp becomes low, the value of Rpp increases lowering the voltage at detection node 301. Then, through the series inverters 340, 350, 60 and series inverters 370, 380, 390, detection signal ΦDET and clamp signal ΦCLMP with high state are generated.

Conversely, if the level of the pumped voltage Vpp becomes high, the reduced Rpp causes an increase of voltage at detection node 301. Therefore, detection signal ΦDET and clamp signal ΦCLMP become low.

As shown in FIG. 7A, detection signal ΦDET of high state is fed back to the pumping circuit 500 to drive the oscillator 110 to perform the Vpp pumping operation, thus raising the reduced level of the pumped voltage Vpp. If the detection signal ΦDET is in low state, the oscillator 110 is disabled no longer performing the pumping operation.

Figure 7F:
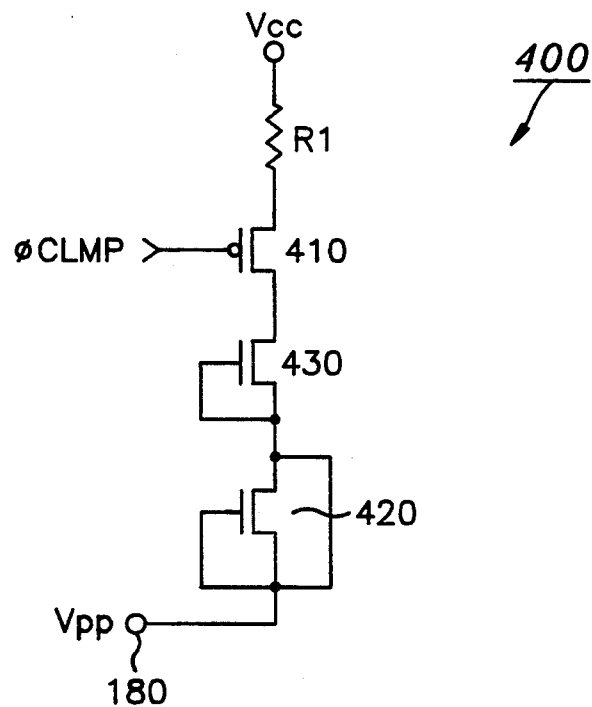
FIG. 7F, 7G and 7H are circuits for showing various embodiments of the clamper elements of FIG. 6.

In FIG. 7F, there is shown the circuit design for first and second clampers 800 and 900 of FIG. 6 which are provided for preventing voltage Vpp from being raised to an undesirable level. These serve to pull an excessively pumped voltage Vpp down to source voltage Vcc in order to prevent destruction of the components as when the level of the pumped voltage Vpp exceeds a given value.

Namely, as shown in FIG. 7F, when the level of the pumped voltage Vpp increases, the detector 700 produces a clamp signal ΦCLMP of low state applied to the gate of the PMOS transistor 410, so that the excessively pumped voltage Vpp is discharged via the channels of cascaded NMOS transistors 420, 430 and PMOS transistor 410 to source voltage terminal Vcc. When the circuit is activated, the pumped voltage Vpp is dropped across the NMOS transistor 430 by about Vcc+Vth.

Figure 7G:
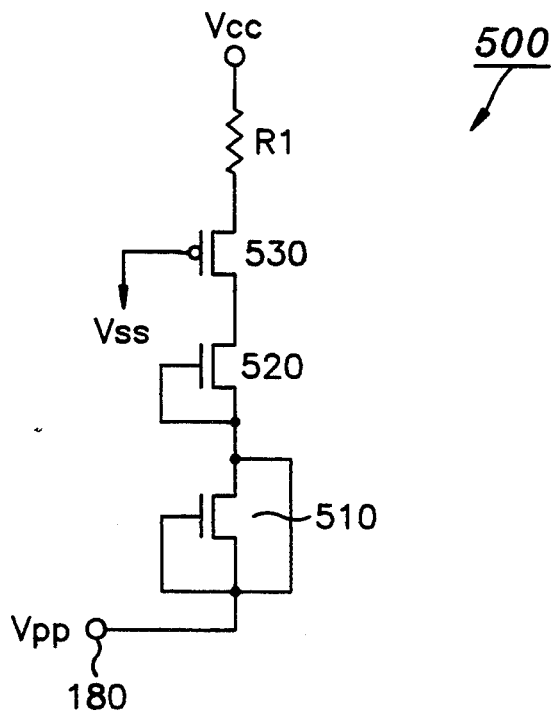

The circuit of FIG. 7G uses cascaded NMOS transistors 510, 520 and PMOS transistor 530 to discharge the pumped voltage Vpp without using the clamp signal ΦCLMP as in FIG. 7F. Of course, the pumped voltage Vpp is dropped across NMOS transistor 520 by Vcc+Vth. The pull-down level of the pumped voltage is determined by the number (n) corresponding to the number of NMOS transistors cascaded between the Vpp terminal and Vcc terminal and contribute to the voltage dropping. The circuits of FIGS. 7F and 7G show the exemplary case of n=1. If n cascaded NMOS transistors are provided, the pumped voltage Vpp will be dropped by Vcc+nVth.

Figure 7H:
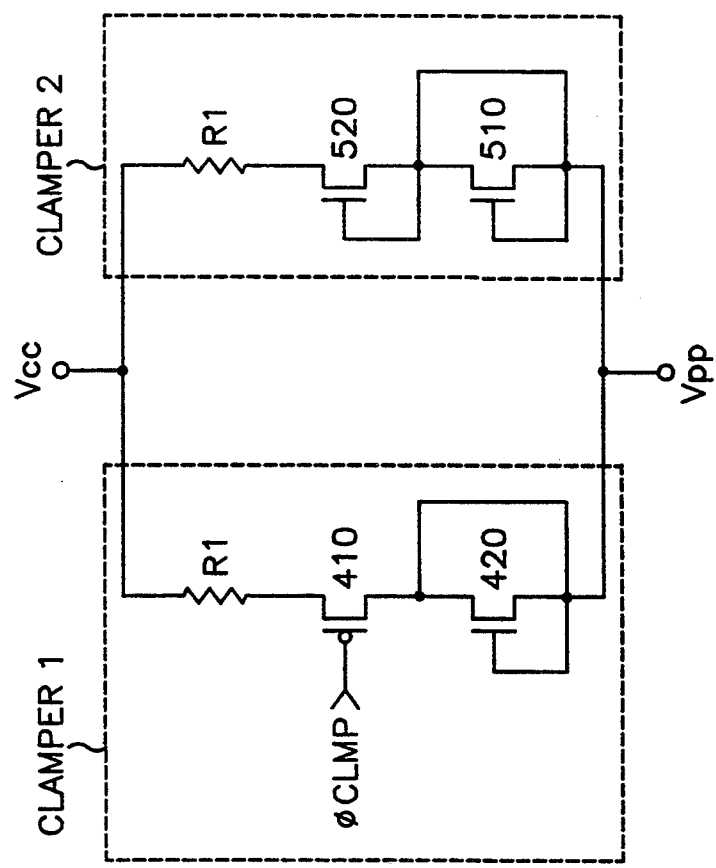

In FIG. 7H, clamper 800 includes two clamper circuits arranged between the Vcc and Vpp terminals. Clamper circuits 1 and 2 have a substantially similar structure as those in FIG. 7F and 7G, respectively, PMOS transistor 530 and NMOS transistor 430 having been eliminated.

Assuming that the threshold voltages of NMOS transistors 420, 520, 510 are respectively Vth1, Vth2, Vth3 (in this case, the relationship between the threshold voltages is assumed Vth1<Vth2+Vth3), clamper circuit 1 works in the same manner as the circuit of FIG. 7F.

In clamper circuit 2, if the voltage level at node C has the value of Vcc+Vth2, NMOS transistor 520 is turned on, and if the voltage level of the Vpp terminal has a value of Vcc+Vth2+Vth3 or more, NMOS transistor 510 is turned on, so that a current path is formed between the Vcc and Vpp terminals to discharge the pumped voltage.

Thus, in FIG. 7H, until the pumped voltage level comes to be within the range of Vcc+Vth2 to Vcc+Vth2+Vth3, clamper circuit 1 uses the clamp signal ΦCLMP to adjust the pumped voltage level at the Vpp terminal as desired. When the pumped voltage level exceeds the value of Vcc+Vth2+Vth3, clamper circuit 2 turns on NMOS transistors 520 and 510 to discharge the pumped voltage at the Vpp terminal. Hence, the pumped voltage level may be adjusted to have any value between Vcc+Vth2+Vth3 and Vcc+Vth1.

Figure 8:
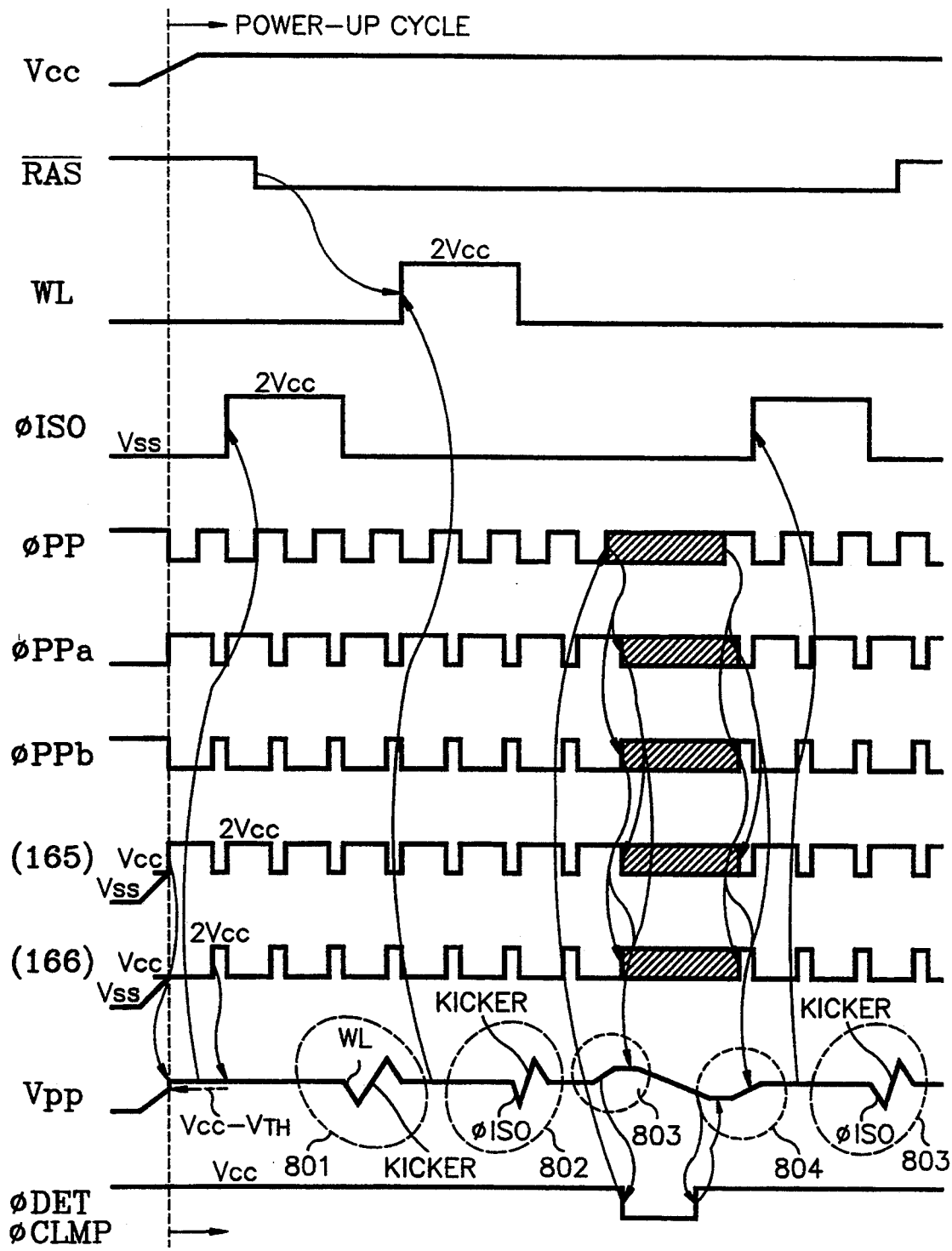
FIG. 8 is a timing diagram for illustrating the operation of the circuit of FIG. 6.

Hereinafter, the operation of the inventive circuit is described with reference to FIG. 8, where the arrow lines show the relationship between the signals. Before supplying source voltage Vcc (low state), the output of inverter 112 of pumping circuit 500 (see FIG. 7B) is low and therefore pumping clock pulses ΦPP are kept "high". Upon supplying source voltage Vcc, first and second pumping nodes 165 and 166 and the gates of first and second isolation transistors 141 and 142 are precharged with source voltage Vcc by way of first and second precharge circuits 160 170. In turn, Vpp node 180 is precharged to voltage Vcc-Vth and the oscillator stage 110 periodically produces the pumping clock pulses ΦPP.

First and second pumping clock pulses ΦPPa and ΦPPb that complementarily work in response to the pumping clock pulses ΦPP, cause first and second pumping nodes 165 and 166 and the gates of first and second isolation transistors 141 and 142 to reach a voltage level of 2Vcc.

Consequently, the voltage at Vpp node 180 is also pumped to 2Vcc. This pumped voltage Vpp of level 2Vcc is dropped due to charge sharing when supplied to the word lines, separation gates, etc. (see 801 and 802 in FIG. 8).

In order to compensate for this voltage drop, active kicker 600 of FIG. 6 is used, its operation having been described with reference to FIG. 7C.

When pumped voltage Vpp is excessively raised owing to excessive pumping, clamp signal ΦCLMP becomes low (see FIG. 7E). This causes the level of the pumped voltage Vpp to drop by Vcc+Vth (see 803 in FIG. 8). When the clamp signal ΦCLMP is low, the detection signal ΦDET is also low. This causes the pumping clock pulses ΦPP to be kept high as in the initial disabled state. Thus the pumping circuit 500 no longer performs the pumping operation, so that the level of the pumped voltage Vpp may be excessively dropped (see 804 in FIG. 8). However, detection signal ΦDET is made high to restart the pumping operation.

As described above, active kicker 600 compensates for a drop of pumped voltage Vpp, detector 700 keeps the present Vpp level stable, and clampers 800 and 900 prevent pumped voltage Vpp from being excessively raised.

Figure 1C:
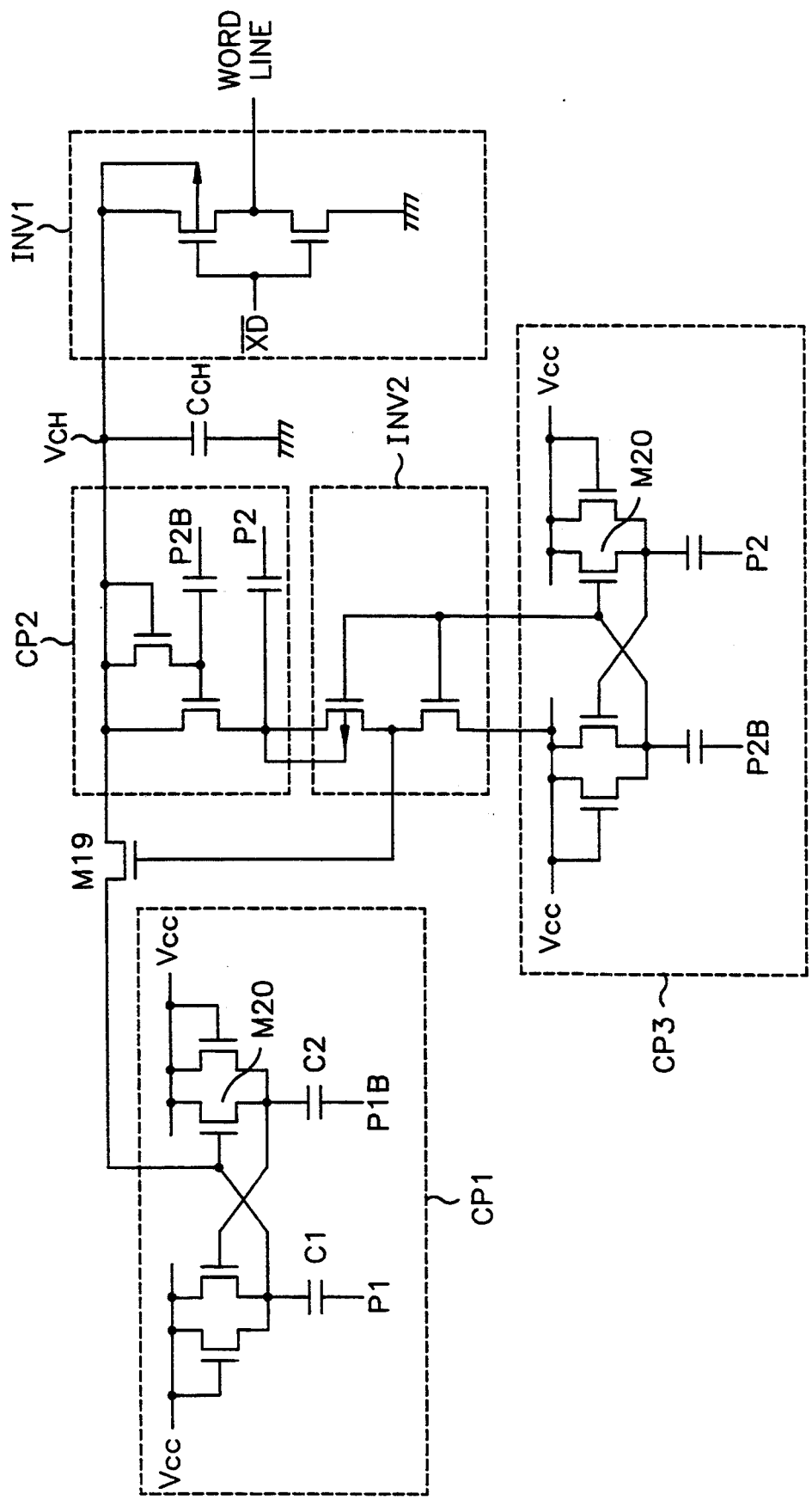
FIG. 1C is a circuit diagram for illustrating a further embodiment of a voltage pumping circuit according to the prior art.

Furthermore, pumping circuit 500 of FIG. 7B and active kicker 600 of FIG. 7C are used to supply the pumped voltage to the bit line isolation transistors without using capacitors as in the conventional circuit of FIG. 1C.

As a result, N-channel and P-channel sense amplifiers may be commonly used thus reducing chip size.

In addition, pumping circuit 500 works only with a source voltage Vcc, thereby reducing total power consumption of the chip.

While this invention has been described in connection with what is presently considered to be the most practical and preferred embodiment, it is to be understood that the invention is not limited to the disclosed embodiment, but, on the contrary, is intended to cover various modifications and equivalent arrangements included within the spirit and scope of the appended claims.

What is claimed is:

1. A voltage pumping circuit in a semiconductor memory device provided with a source operating voltage and including an oscillator circuit for generating a series of pulses, said voltage pumping circuit comprising:

input means for receiving said series of pulses from said oscillator circuit to generate a pair of complementary output signals;

voltage pump means coupled to said input means and responsive to said series of pulses and said source operating voltage for generating at a voltage pumping node a first output voltage level, at an initial power-up state, and thereafter pumping the first output voltage level up to a second output voltage level when the semiconductor memory device is in active operational mode;

detecting means coupled to said voltage pump means for detecting when the second voltage output voltage level has been reached to control the pumping operation of the voltage pump means so as to maintain the second output voltage level at the voltage pumping node;

pumping means for generating at the voltage pumping node the second output voltage level in response to an output from said input means; and bias means coupled to said pumping means and responsive to the source operating voltage for forcing the first output voltage level at the voltage pumping node at the initial power-up state.

2. The voltage pumping circuit of claim 1, further comprising driving means for amplifying the complementary output signals from said input means.

3. The voltage pumping circuit of claim 2, wherein said pumping means comprises a plurality of capacitors each having first and second electrodes, said first electrodes being respectively coupled to amplified complementary output signals from said driving means.

4. The voltage pumping circuit of claim 3, wherein said pumping means further comprises first and second transmission transistors for providing the second output voltage level to said voltage pumping node by way of a charge sharing occurring through respective channels thereof, gates and selected first terminals of the channels of said first and second transmission transistors being respectively coupled to the second electrodes of said plurality of capacitors.

5. The voltage pumping circuit of claim 4, wherein said first and second transmission transistors are alternatively turned-on and turned-off in response to the pair of complementary output signals output from said input means.

6. The voltage pumping circuit of claim 4, wherein said bias means comprises:
   a first bias circuit for providing the source operating voltage to said first terminals of the respective channels of said first and second transmission transistors; and
   a second bias circuit for providing the source operating voltage to the respective gates of said first and second transmission transistors.

7. The voltage pumping circuit of claim 6, wherein said first and second bias circuits in association with each other provide the voltage pumping node with the first output voltage level at the initial power-up state.

8. A voltage pumping circuit provided with a supply voltage and including an oscillator which generates a series of pulses comprising:
   input means for receiving the series of pulses from said oscillator to generate a pair of complementary output signals;
   voltage pumping means for pumping up the voltage level of a signal output from said input means to generate a pumped voltage level at a voltage pumping node;
   bias means for selectively providing the supply voltage at the voltage pumping node
   detecting means coupled to said voltage pumping means for detecting when the pumped voltage level has been reached to control the pumping operation of the volt pumping means so as to maintain the pumped voltage level at the voltage pumping node.

9. The voltage pumping circuit of claim 8, wherein said voltage pumping means comprises a plurality of capacitors each having first and second electrodes, said first electrodes being respectively coupled to amplified complementary output signals from said input means.

10. The voltage pumping circuit of claim 9, wherein said voltage pumping means further comprises first and second diode-connected transmission transistors for providing the pumped voltage level to said voltage pumping node by way of a charge sharing occurring through respective channels thereof, gates and selected first terminals of the channels of said first and second transmission transistors being respectively coupled to the second electrodes of said plurality of capacitors.

11. The voltage pumping circuit of claim 10, wherein said first and second diode-connected transmission transistors are alternatively turned-on and turned-off in response to the pair of complementary output signals from said input means.

12. The voltage pumping circuit of claim 11, wherein said bias means provides the supply voltage to the first terminal of respective channels of said first and second diode-connected transmission transistors.

13. A voltage pumping circuit in a semiconductor memory device having an oscillator for generating a series of pulses comprising:
   input means for receiving the series of pulses from said oscillator to generate a pair of complementary output signals;
   driver means for amplifying output signals from said input means;
   voltage pumping means comprising a plurality of capacitors each having first and second electrodes, said first electrodes being respectively coupled to amplified output signals from said driving means;
   transmission means coupled to said second electrodes of said plurality of capacitors of said voltage pumping means for generating a pumped voltage at a voltage pumping node; and
   bias means for forcing a voltage, substantially identical to the source operating voltage, at the voltage pumping node at an initial power-up state.

14. The voltage pumping circuit of claim 13, further comprising detecting means coupled to said voltage pumping means for detecting when the pumped voltage level has been reached to control the pumping operation of the voltage pumping means so as to maintain the pumped voltage level at the voltage pumping node.

15. A voltage pumping circuit in a semiconductor memory device having a voltage pumping node to which a pumped voltage higher than a supply voltage is applied during active operational mode comprising:
   input means for receiving an enable input signal;
   voltage pumping means for generating said pumped voltage in response to an output from said input means, wherein if the voltage level of the pumped voltage drops during active operational mode, the voltage pumping means detects the voltage drop to raise the pumped voltage to a predetermined level; and
   output means for supplying the pumped voltage to said voltage pumping node;
   precharge means for precharging the output from said voltage pumping means to a voltage substantially identical to the supply voltage during non-active operational mode of the semiconductor memory device so as to increase the voltage pumping efficiency of said voltage pumping means.

16. The voltage pumping circuit of claim 15, wherein said voltage pumping circuit is enabled only during active operational mode of the semiconductor memory device.

17. The voltage pumping circuit of claim 15, wherein said voltage pumping means comprises at least one voltage pumping capacitor coupled to and responsive to the output of said input means.

18. The voltage pumping circuit of claim 15, wherein said precharge means comprises:
   at least one voltage pumping capacitor coupled to the output of said input means; and
   a plurality of pull-up transistors coupled between the voltage pumping capacitor and the pumped voltage output;
   whereby an initial output voltage of said voltage pumping means is precharged substantially identical to the supply voltage by the pull-up transistors during non-active operational mode of the semiconductor memory device.

19. The voltage pumping circuit of claim 15, wherein said enable input signal is one of a first signal generated in association with row or column address strobe signals and a second signal generated upon a power-up of the semiconductor memory device.

20. A voltage pumping circuit in a semiconductor memory device having a voltage pumping node to which a pumped voltage higher than a supply voltage is applied during active operational mode comprising:
   input means for receiving an enable input signal;
   voltage pumping means for generating said pumped voltage in response to an output from said input means;
   precharge means coupled to the output of said input means for precharging a voltage at the voltage pumping node which is substantially identical to the supply voltage during non-active operational mode of the semiconductor memory device;

output means for supplying the pumped voltage to the voltage pumping node during active operational mode of the semiconductor memory device; and control means for controlling operation of said output means in response to the output from said input means.

21. The voltage pumping circuit of claim 20, wherein said voltage pumping means comprises:

a driver circuit coupled to the output of said input means; and a first voltage pumping capacitors having first and second electrodes, the first electrode being coupled to the output of said driver circuit and the second electrode being coupled to the precharge means.

22. The voltage pumping circuit of claim 21, wherein said precharge means comprises:

a second voltage pumping capacitor having first and second electrodes, the first electrode being coupled to the output of said input means;

a first pull-up transistor having its gate connected to the supply voltage and its channel connected between the supply voltage and the second electrode of said second voltage pumping capacitor;

a second pull-up transistor having its gate connected to the voltage pumping node and its channel connected between the supply voltage and the second electrode of said second voltage pumping capacitor;

a third pull-up transistor having its gate connected to the supply voltage and its channel connected between the supply voltage and an output of said voltage pumping means; and a fourth pull-up transistor with a gate connected to the second electrode of said second voltage pumping capacitor and a channel connected between the supply voltage and the output of said voltage pumping means.

23. The voltage pumping circuit of claim 21, wherein said control means comprises:

a third voltage pumping capacitor having first and second electrodes, the first electrode being coupled to the output of said input means and the second electrode being coupled to a control terminal of said output means;

a fourth voltage pumping capacitor having first and second electrodes, the first electrode be coupled to the output of said input means;

a fifth pull-up transistor having its gate connected to the supply voltage and its channel connected between the supply voltage and the second electrode of said fourth voltage pumping capacitor; and a sixth pull-up transistor having its gate connected to the second electrode of said fourth voltage pumping capacitor and its channel connected between the second electrode of said third voltage pumping capacitor and the supply voltage.

24. The voltage pumping circuit of claim 20, wherein said enable input signal is one of a first signal generated in association with row or column address strobe signals and a second signal generated upon a power-up of the semiconductor memory device.

25. A voltage pumping circuit having an input node for sensing transition of an enable input signal and compensating for a voltage drop of a pumped voltage output therefrom, comprising:

voltage pumping means coupled to said input node for generating said pumped voltage in response to a voltage level transition of the enable input signal;

precharge means coupled to said input node for precharging an output of said voltage pumping means to a voltage which is substantially identical to a source supply voltage during non-active operational mode of the semiconductor memory device;

output means for outputting the pumped voltage of said voltage pumping means during active operational mode of the semiconductor memory device; and control means for controlling operation of said output means in response to the enable input signal at the input node.

26. The voltage pumping circuit of claim 25, wherein said enable input signal is one of a first signal generated in association with row or column address strobe signals and a second signal generated upon a power-up of the semiconductor memory device.

27. A semiconductor memory device having electrical circuitry to which is applied a pumped voltage higher than a supply voltage, said semiconductor memory device comprising:

a voltage pumping node coupled to the electrical circuitry;

voltage pumping means for pumping up the voltage level to be sent to the voltage pumping node during a power-up cycle of the semiconductor memory device to generate the pumped voltage;

isolation means for supplying the pumped voltage to said voltage pumping node;

active kicker means coupled to the voltage pumping means for compensating for a voltage drop in the pumped voltage in response to signals output from the electrical circuitry;

detecting means for feeding-back to said voltage pumping means a sensing signal indicative of a variation in the pumped voltage; and clamping means for receiving the sensing signal to clamp the pumped voltage so as to compensate for a voltage level pulled-up above a predetermined maximum.

28. The semiconductor memory device of claim 27, wherein said voltage pumping means comprises:

an oscillator for generating a pumping clock in response to the supply voltage and the sensing signal; and first and second charge pumps having first and second pumping nodes, said first and second charge pumps each operating complementarily in response to the pumping clock.

29. The semiconductor memory device of claim 28, wherein said isolation means comprises:

a first isolation transistor having its gate connected to the first pumping node and its channel connected between the first pumping node and the voltage pumping node; and a second isolation transistor having its gate connected to the second pumping node and its channel connected between the second pumping node and the voltage pumping node.

30. The semiconductor memory device of claim 29, further comprising precharge means for precharging the voltage level at said first and second pumping nodes to a predetermined voltage.

31. The semiconductor memory device of claim 27, further comprising means for precharging the voltage level at the voltage pumping node to a predetermined voltage.

32. The semiconductor memory device of claim 27, wherein said active kicker means comprises:
a logic combination circuit for receiving signals from the electrical circuitry;
a kicking node;
a pre-kicker for setting a voltage at the kicking node to a first level when the output of the logic combination circuit is at a first state;
a kicking driver for converting the voltage at the kicking node from said first level to a second level when the output of the logic combination circuit is at a second state; and
a third isolation transistor having its channel connected between the kicking node and the voltage pumping node.

33. The semiconductor memory device of claim 27, wherein said clamping means comprises a DC current path controllable by the sensing signal, disposed in series between the pumped voltage and the supply voltage.

34. The semiconductor memory device of claim 27, wherein said clamping means comprises a DC current path disposed in series between the pumped voltage and the supply voltage.

35. A semiconductor memory device including:
a plurality of memory cells;
a plurality of word lines coupled to the memory cells;
a plurality of bit line pairs coupled to the memory cells;
a plurality of input/output lines coupled to the bit line pairs;
a plurality of sense amplifiers coupled to the bit line pairs for amplifying a voltage difference between the respective bit lines in each pair;
a plurality of isolation gates coupled between the bit line pairs and the input/output lines; and
a plurality of word line drivers for selecting the word lines, said semiconductor memory device further comprising:
a voltage pumping node coupled to respective input nodes in said semiconductor memory device to which a pumped voltage is provided;
voltage pumping means for generating the pumped voltage at a power-up cycle of the semiconductor memory device;
isolation means for supplying the pumped voltage to said voltage pumping node;
active kicker means coupled to said voltage pumping means for compensating for a voltage drop in the pumped voltage, said active kicker means receiving a voltage signal from output nodes in said semiconductor memory device to which a pumped voltage has been provided;
detecting means for feeding-back to said voltage pumping means a sensing signal indicative of a variation in the pumped voltage; and
clamping means for receiving the sensing signal to clamp the pumped voltage so as to compensate for a pulse voltage level pulled-up above a predetermined maximum.

36. The semiconductor memory device of claim 35, wherein said voltage pumping means comprises:
an oscillator for generating a pumping clock in response to states of a supply voltage and the sensing signal; and
first and second charge pumps having first and second pumping nodes, said first and second charge pumps each operating complementarily in response to the pumping clock.

37. The semiconductor memory device of claim 36, wherein said isolation means comprises:
a first isolation transistor having its gate connected to the first pumping node and its channel connected between the first pumping node and the voltage pumping node; and
a second isolation transistor having its gate connected to the second pumping node and its channel connected between the second pumping node and the voltage pumping node.

38. The semiconductor memory device of claim 37, further comprising means for precharging a voltage at the first and second pumping nodes to a predetermined voltage.

39. The semiconductor memory device of claim 35, further comprising means for precharging a voltage at the voltage pumping node to a predetermined voltage.

40. The semiconductor memory device of claim 35, wherein said active kicker means comprises:
a logic combination circuit for receiving control signals from the semiconductor memory device output nodes;
a kicking node;
a pre-kicker for setting a voltage at the kicking node to first level when the output of the logic combination circuit is at a first state;
a kicking driver for converting the voltage at the kicking node from said first level to a second level when the output of the logic combination circuit is at a second state; and
a third isolation transistor having its channel connected between the kicking node and the voltage pumping node.

41. The semiconductor memory device of claim 35, wherein said clamping means comprises a DC current path controllable by the sensing signal, disposed in series between the pumped voltage and the supply voltage.

42. The semiconductor memory device of claim 35, wherein said clamping means comprise a DC current path disposed in series between the pumped voltage and the supply voltage.

43. The semiconductor memory device of claim 35, wherein said clamping means comprises:
a first clamping circuit for supplying a first voltage to the voltage pumping node if the supply voltage is identical to the first voltage; and
a second clamping circuit for supplying a second voltage higher than the first voltage to the voltage pumping node if the supply voltage is identical to the second voltage.

* * * * *